(12) United States Patent
Tsukada

(10) Patent No.: US 9,286,977 B2
(45) Date of Patent: Mar. 15, 2016

(54) SEMICONDUCTOR DEVICE

(71) Applicant: Micron Technology, Inc., Boise, ID (US)

(72) Inventor: Shuichi Tsukada, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/473,489

(22) Filed: Aug. 29, 2014

(65) Prior Publication Data

US 2015/0063003 A1 Mar. 5, 2015

(30) Foreign Application Priority Data

Aug. 29, 2013 (JP) ................................. 2013-178337

(51) Int. Cl.
*G11C 11/00* (2006.01)
*G11C 13/00* (2006.01)
*H01L 27/24* (2006.01)

(52) U.S. Cl.
CPC .......... *G11C 13/004* (2013.01); *G11C 13/0007* (2013.01); *G11C 13/0026* (2013.01); *G11C 13/0069* (2013.01); *G11C 13/0038* (2013.01); *G11C 2013/0054* (2013.01); *G11C 2213/79* (2013.01); *H01L 27/24* (2013.01)

(58) Field of Classification Search
CPC ............. G11C 13/0069; G11C 13/004; G11C 13/0004; G11C 13/0007; H01L 27/24
USPC .................................................. 365/148, 100
See application file for complete search history.

(56) References Cited

U.S. PATENT DOCUMENTS

| | | | | |
|---|---|---|---|---|
| 6,088,272 A * | 7/2000 | Urata | ........................ | G11C 7/00 365/189.05 |
| 6,456,524 B1 * | 9/2002 | Perner | ..................... | G11C 11/16 365/148 |
| 7,283,407 B2 * | 10/2007 | Inoue | ........................ | G11C 7/06 365/148 |
| 7,692,979 B2 | 4/2010 | Fuji et al. | | |
| 8,780,612 B2 * | 7/2014 | Kim | .................... | G11C 13/0069 365/148 |
| 2012/0314481 A1 * | 12/2012 | Close | ...................... | G11C 5/147 365/148 |
| 2013/0077383 A1 * | 3/2013 | Huang | ................ | G11C 13/0004 365/148 |

FOREIGN PATENT DOCUMENTS

| JP | 2002216482 A | 8/2002 |
|---|---|---|
| JP | 2007133930 A | 5/2007 |
| JP | 2008065953 A | 3/2008 |
| JP | 2008192274 A | 8/2008 |

* cited by examiner

*Primary Examiner* — Pho M Luu
(74) *Attorney, Agent, or Firm* — Dorsey & Whitney LLP

(57) ABSTRACT

A semiconductor device including: a resistive memory element; a data line electrically coupled to the resistive memory element; a control line; a power supply line; and a control circuit including a first constant current element, a first transistor, and a second transistor. In the control circuit, the first transistor has a gate coupled to the data line, one of a source and a drain coupled to the first constant current element, and the other one of the source and the drain coupled to the power supply line. The second transistor has a gate coupled to one of the source and the drain of the first transistor, one of a source and a drain coupled to the data line, and the other one of the source and the drain coupled to the control line.

20 Claims, 22 Drawing Sheets

SEMICONDUCTOR DEVICE

TECHNICAL FIELD

Reference to Related Application

This application is based upon and claims the benefit of priority of Japanese patent application No. 2013-178337 filed on Aug. 29, 2013, the disclosure of which is incorporated herein in its entirety by reference thereto.

Embodiments of the present invention relates to a semiconductor device. In particular, embodiments of the present invention relates to a read circuit in a semiconductor device which uses resistive elements that store data by changing resistance.

BACKGROUND

Semiconductor devices using resistive elements have been studied and developed, typical examples of which include an ReRAM (Resistive Random Access Memory), a PRAM (Phase Change Memory), and an STT-RAM (Spin Torque Transfer Random Access Memory). Memory element characteristics of an ReRAM, a PRAM, and an STT-RAM are illustrated in FIG. 13 in Japanese Patent Kokai Publication No. 2008-65953A (PTL 2), FIGS. 17 and 18 in Japanese Patent Kokai Publication No. 2008-130166A (PTL 1), and FIG. 4 in Japanese Patent Kokai Publication No. 2008-192274A (PTL 3), respectively.

A memory cell has a resistive element to which data is written by applying a write voltage across the resistive element to cause a current or an electric field. More specifically, the resistance value of the resistive element is changed by the amplitude or polarity of the write voltage. In contrast, the memory cell is read by applying a read voltage across the resistive element, for example, the voltage being smaller than that used for writing. More specifically, data written in the memory cell is read by detecting whether the resistive element has low resistance or high resistance on the basis of the amplitude of the current that flows by the application of the read voltage. This read voltage needs to be sufficiently small so that the data is not rewritten and the resistance value of the resistive element is not changed.

Japanese Patent Kokai Publications Nos. 2002-216482A and 2007-133930A are listed as PTL 4 and PTL 5, respectively.

The following analysis has been given from a viewpoint of embodiments of the present invention.

FIGS. 3 and 4 illustrate an exemplary embodiment of the present invention. Problems with the semiconductor devices according to the related techniques will be described in view of FIGS. 3 and 4. The semiconductor devices according to the related techniques include data line control circuits, one of which is illustrated in FIGS. 22A and 22B as a prototype circuit, in place of data line control circuits 6 in FIG. 3. In FIG. 3, each data line 3 is coupled to a plurality of multiplexers 7. When a memory cell MC is read/written, a single multiplexer 7 is selectively activated for each data line 3. As a result, a single bit line BL is electrically coupled to each data line 3. Since each data line 3 extends for a long distance as illustrated in FIG. 3, each data line 3 has large parasitic capacitance.

FIG. 4 is a circuit diagram of a part of a memory array 8 in FIG. 3. A memory cell MC is arranged at each intersection of a bit line BL and a word line WL. When a memory cell MC is read, VSS is supplied to a source plate SP and a voltage of a read reference signal VREADREF is supplied to a corresponding data line 3. In this way, the voltage of the read reference signal VREADREF is applied across the resistive memory element 2 of the memory cell MC located at the intersection of a selected word line WL and a selected bit line BL.

The following two conditions need to be satisfied to read a memory cell MC at high speed. The first condition is charging a corresponding data line 3 with the voltage of the read reference signal VREADREF at high speed. Since the data lines 3 have large parasitic capacitance, a current drive circuit having a large current drive capability is necessary.

The second condition is acquiring a larger read current by setting a larger voltage as the voltage of the read reference signal VREADREF. However, the voltage of the read reference signal VREADREF needs to be limited so that the resistance value of the corresponding resistive memory element 2 is not changed when the memory cell MC is read. Namely, it is desirable to increase the setting voltage VREADREF to a voltage level that is close to a voltage limit by accurately controlling the charging so that the difference between the voltage limit and the setting voltage VREADREF is small. Thus, in the above charging operation, it is required that the data line 3 be charged up to the setting voltage VREADREF without causing an overshoot and without influencing the resistance value of the resistive memory element 2.

To satisfy the above first and second conditions, a read circuit including a feedback circuit using a differential amplifier is widely used (see FIG. 6 in PTL 3 and FIG. 11 in PTL 1). In addition, FIG. 44B in PTL 4 illustrates a general circuit as a specific circuit of a differential amplifier.

FIGS. 22A and 22B are circuit diagrams of a data line control circuit configured according to the known techniques according to the above PTLs. The data line control circuit includes a read data line drive circuit 243 and a current drive circuit 35. FIG. 22B specifically illustrates internal circuits of the differential amplifier AMP3V and the current drive circuit 35 in FIG. 22A. In FIG. 22A, the read data line drive circuit 243 includes: a feedback circuit 244 including the differential amplifier AMP3V; and an NMOS transistor N1. A data line 3 is coupled to an inverting input terminal of the differential amplifier AMP3V, and a power supply line coupled to the read reference signal VREADREF is coupled to a non-inverting input terminal of the differential amplifier. In addition, an output terminal of the differential amplifier AMP3V is coupled to a gate of the NMOS transistor N1.

When the data line 3 is charged in a read operation, a current drive node 4 is supplied with a high voltage (for example, VDD) by the current drive circuit 35. In addition, the read data line drive circuit 243 performs feedback control to quickly and accurately charge the data line 3 with the voltage of the read reference signal VREADREF.

In contrast, to output data at high speed, many memory cells MC need to be read simultaneously in a single read operation. Once read data is latched in data line control circuits corresponding to a plurality of memory cells MC, the read data can be outputted sequentially to input/output terminals DQ via read/write buses RWBS and an I/O circuit 107 in accordance with a high-speed clock cycle. However, since reading data from memory cells MC requires relatively long time, many memory cells MC need to be read simultaneously in a single read operation.

To increase the number of memory cells MC that are simultaneously read in a single read operation, it is necessary to reduce the number of bit lines BL coupled to each multiplexer 7 and arrange more data lines 3 and data line control circuits at shorter intervals. Namely, the data line control circuits need to be arranged at shorter intervals. However, in the case of the data line control circuit in FIG. 22 according to the related techniques, the differential amplifier AMP3V in the feedback circuit 244 has a complex circuit configuration and includes many elements (see FIG. 22B). Thus, there is a problem that it is difficult to arrange many data line control circuits at shorter intervals.

Therefore, to realize a high-speed read operation, data line control circuits that can be arranged at short intervals are demanded.

SUMMARY

A semiconductor device according to a first aspect of the present invention includes: a resistive memory element; a data line electrically coupled to the resistive memory element; a control line; a power supply line; and a control circuit including a first constant current element, a first transistor, and a second transistor. In the control circuit, the first transistor has a gate coupled to the data line, one of a source and a drain coupled to the first constant current element, and the other one of the source and the drain coupled to the power supply line. The second transistor has a gate coupled to one of the source and the drain of the first transistor, one of a source and a drain coupled to the data line, and the other one of the source and the drain coupled to the control line.

A semiconductor device according to a second aspect of the present invention includes a resistive memory element, a data line electrically coupled to the resistive memory element, a control line, a control circuit including a feedback circuit coupled to the data line and controlling a potential of a second node, a second transistor, and a first switch element arranged between a first power supply and the control line. The second transistor has a gate coupled to an output node of the feedback circuit, one of a source and a drain coupled to the data line, and the other one of the source and the drain coupled to the control line. In addition, the feedback circuit includes a third switch element between the second node and the output node of the feedback circuit.

A semiconductor device according to a third aspect of the present invention includes a plurality of resistive memory cells, a plurality of first data lines coupled to the resistive memory cells, respectively, a plurality of second data lines, and a voltage generator configured to generate an internal voltage at an output node. The semiconductor device further comprises a plurality of feedback circuits each coupled to a corresponding one of the first data lines, a corresponding one of the second data lines and the output node of the voltage generator, and being configured to drive the corresponding one of the second data lines in response to a potential of the corresponding one of the first data lines and the internal voltage.

PREFERRED MODES

Figure 1:
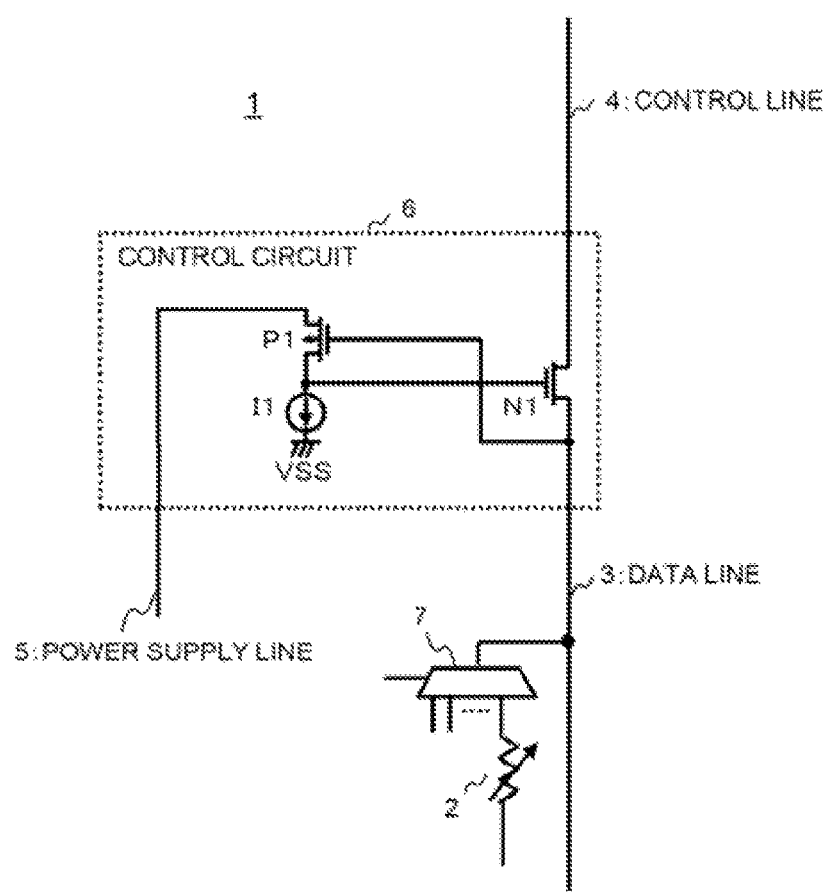
FIG. 1 is a block diagram illustrating a control circuit and a peripheral circuit thereof in a semiconductor device according to an exemplary embodiment.

First, outlines of exemplary embodiments of the present invention will be described. The reference characters in the following outlines of the exemplary embodiments are merely used as examples to facilitate understanding of the present invention, not to limit the present invention to the illustrated modes.

As illustrated in FIG. 1, a semiconductor device 1 according to an exemplary embodiment includes a resistive memory element 2, a data line 3 electrically coupled to the resistive memory element 2, a control line 4, a power supply line 5, and a control circuit 6 including a first constant current element I1, a first transistor P1, and a second transistor N1. In the control circuit 6, the first transistor P1 has a gate coupled to the data line 3, one of a source and a drain coupled to the first constant current element I1, and the other one of the source and the drain coupled to the power supply line 5. In addition, the second transistor N1 has a gate coupled to one of the source and the drain of the first transistor P1, one of a source and a drain coupled to the data line 3, and the other one of the source and the drain coupled to the control line 4.

In this way, the control circuit 6 can be configured simply with the first transistor P1, the first constant current element I1, the second transistor N1 (namely, the feedback circuit 244 in FIG. 22 can be configured simply with the first transistor P1 and the first constant current element I1 alone). Consequently, a plurality of control circuits 6 each being configured as described above can be arranged at shorter intervals. Thus, it is possible to provide a semiconductor device including control circuits that can perform a read operation quickly and accurately with a simple configuration.

Figure 2:
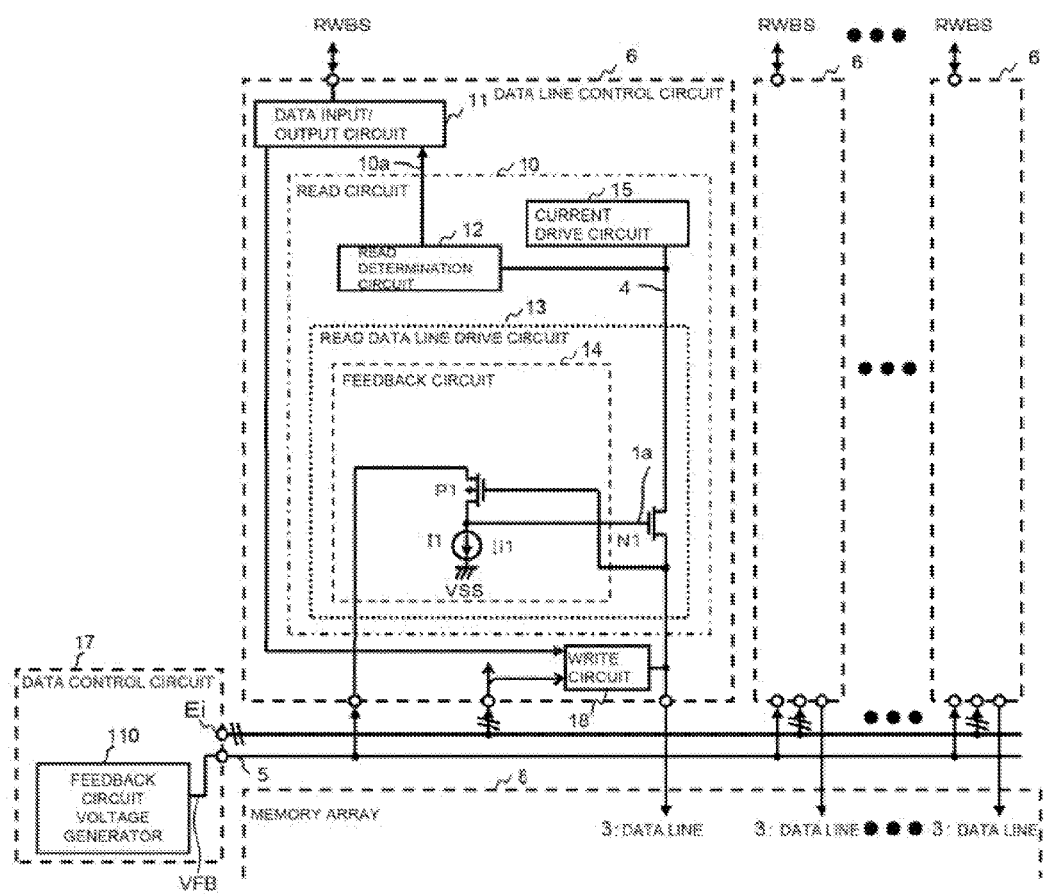
FIG. 2 is a block diagram illustrating a configuration of a data line control circuit in a semiconductor device according to a first exemplary embodiment.
Figure 5:
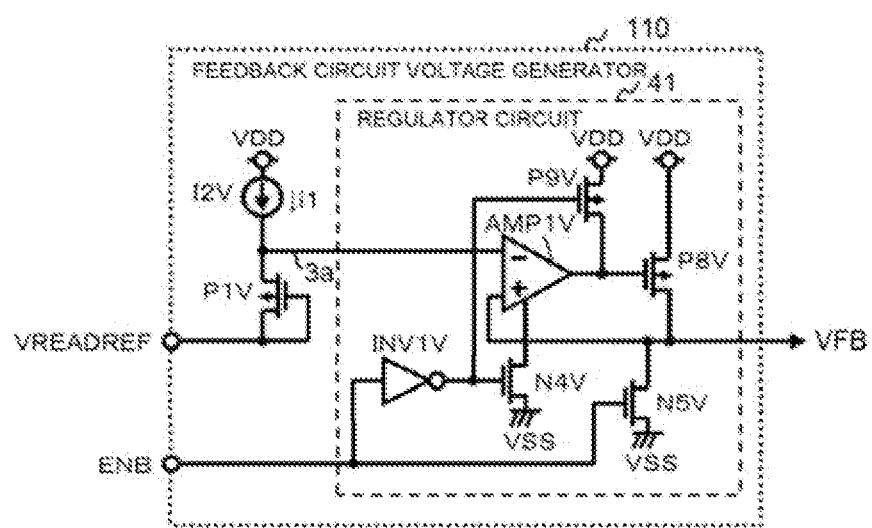
FIG. 5 is a circuit diagram illustrating a part of a data control circuit in the semiconductor device according to the first exemplary embodiment.
Figure 6:
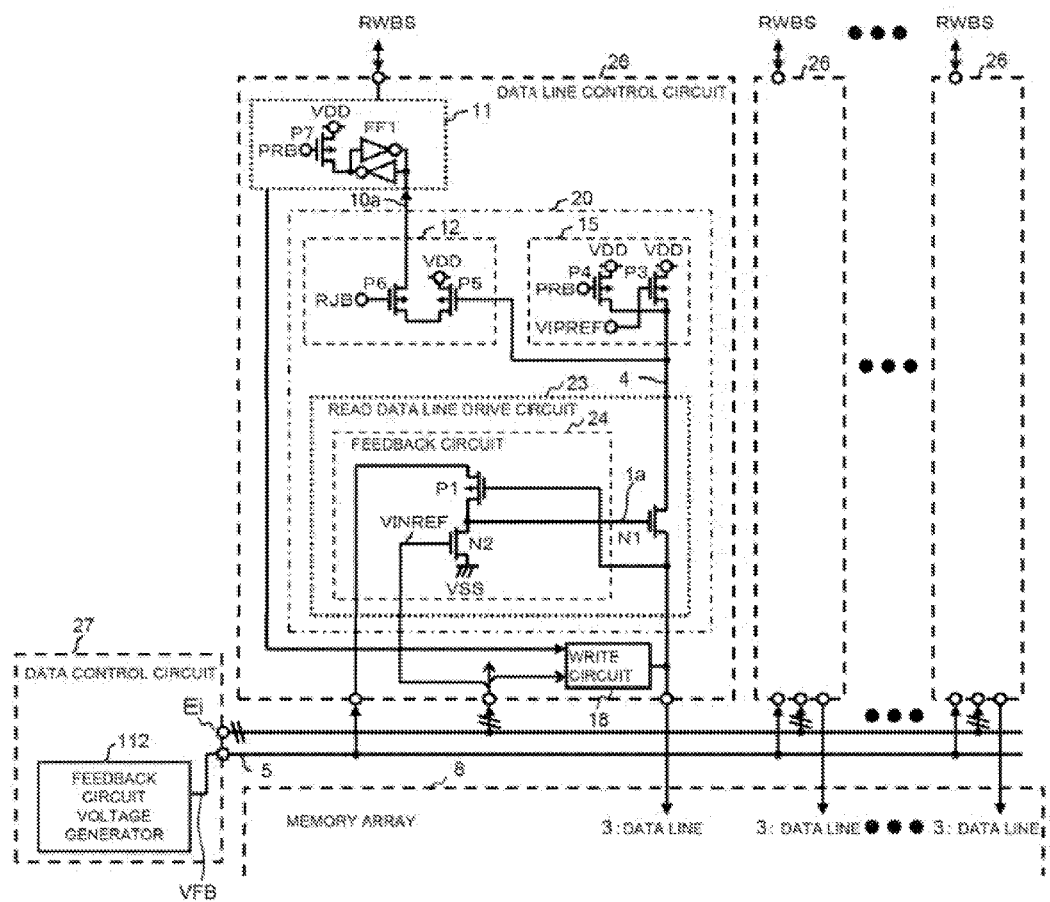
FIG. 6 is a circuit diagram illustrating a data line control circuit in a semiconductor device according to a second exemplary embodiment.

A semiconductor device illustrated in FIG. 2 or 6 further includes a voltage generator 110 illustrated in FIG. 5 supplying a voltage to the power supply line 5. It is preferable that the voltage generator 110 supply a first voltage (V1), which is a sum of a first setting voltage (VREADREF) applied to the data line 3 and an absolute value (|VTP|) of a threshold voltage of the first transistor P1, to the power supply line 5.

Figure 7:
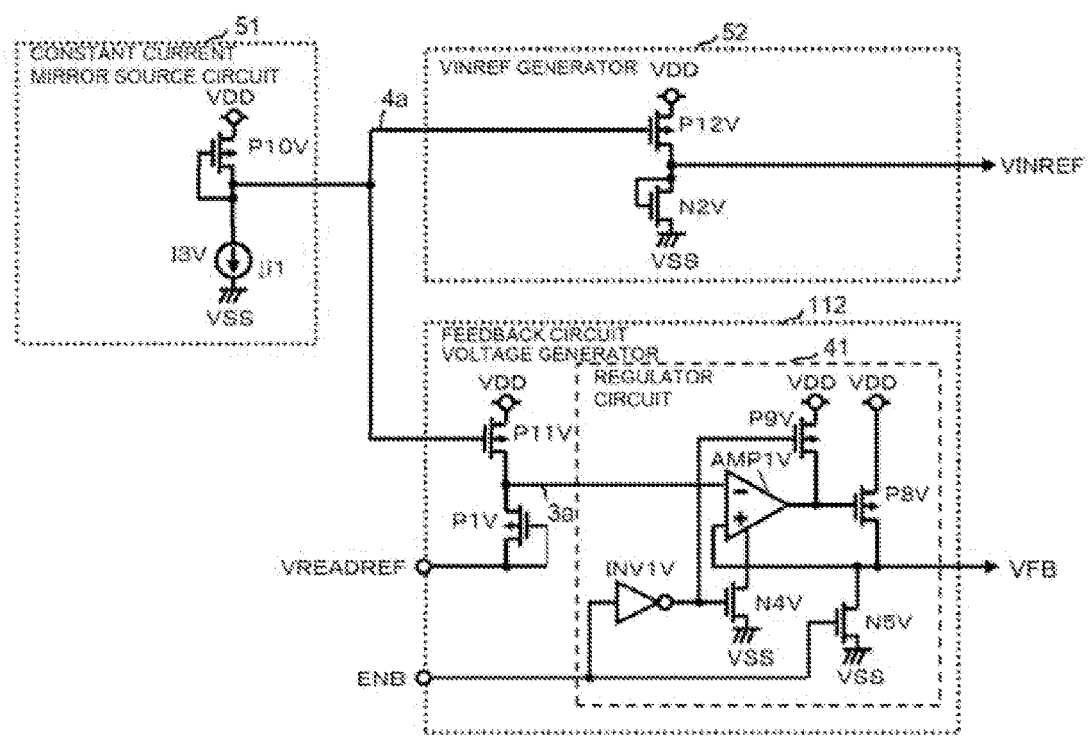
FIG. 7 is a circuit diagram illustrating a part of a data control circuit in the semiconductor device according to the second exemplary embodiment.

In the semiconductor device illustrated in FIG. 6, the first constant current element I1 in a control circuit 26 may be configured by a third transistor N2. As illustrated in FIG. 7, a first constant current source I3V and a fourth transistor N2V that forms a current mirror circuit with the third transistor N2 may be arranged outside the control circuit 26. A current flowing through the third transistor N2 may be controlled by the current mirror circuit on the basis of a current flowing through the first constant current source I3V.

In the semiconductor device illustrated in FIG. 6, it is preferable that the control circuit 26 include a first switch element P4 between a first power supply VDD and the control line 4. The semiconductor device may perform a first control operation (for example, from timing T1 to T2 in FIG. 9) in which the first switch element P4 is set in a conductive state and the first voltage (V1) is supplied from the voltage generator 110 to the power supply line 5 to charge the data line 3 with the first setting voltage (VREADREF).

It is preferable that the semiconductor device illustrated in FIG. 6 further include a second constant current element P3 supplying a constant current to the control line 4. After the first control operation, the semiconductor device may perform a second control operation (from timing T2 to T4 in FIG. 9) in which the first switch element P4 is set in a non-conductive state and the potential of the control line 4 is determined a predetermined time (at timing T3 in FIG. 9) after the timing when the first switch element P4 is set in a non-conductive state (at timing T2 in FIG. 9).

Figure 14:
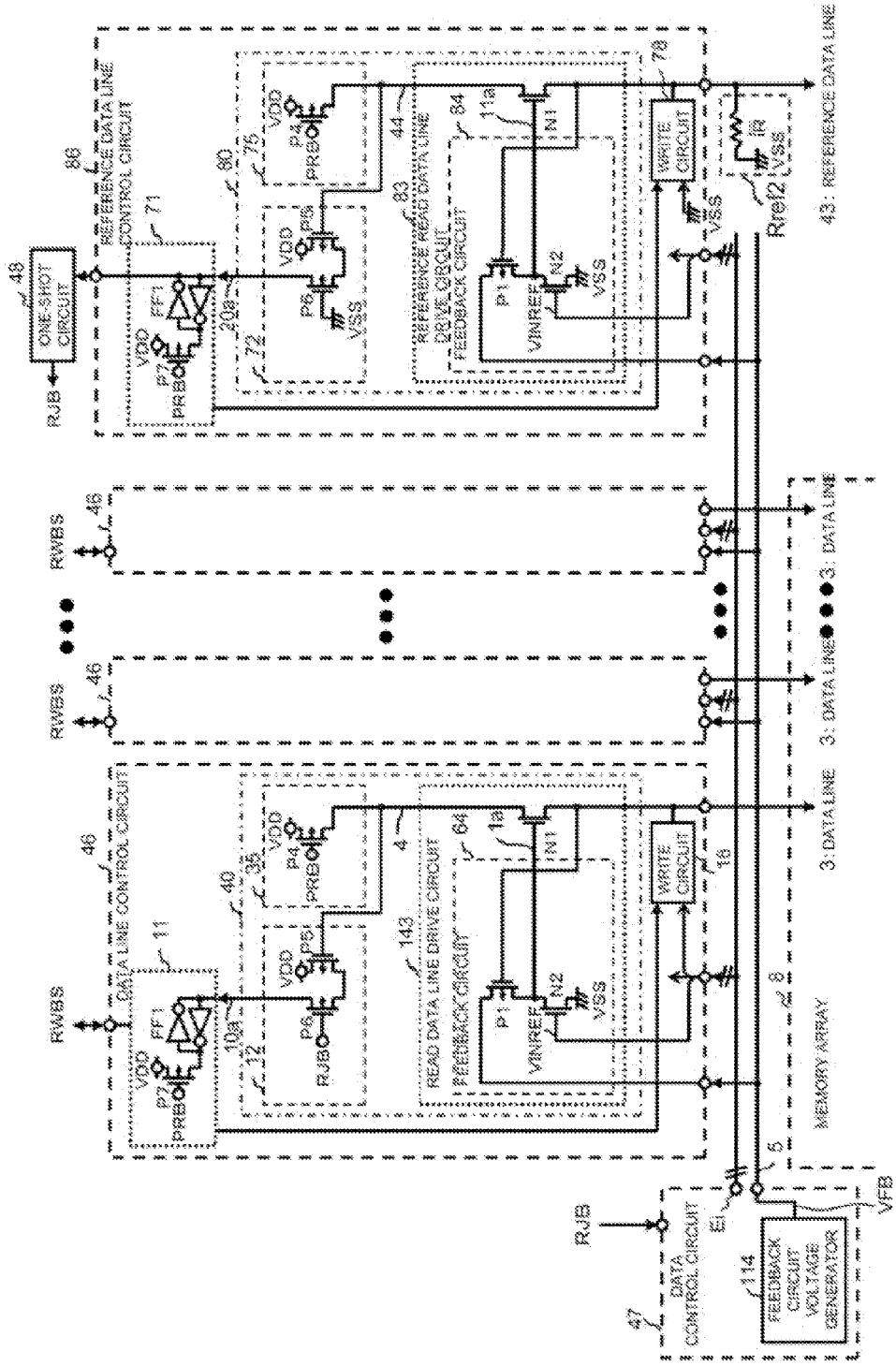
FIG. 14 is a circuit diagram illustrating a data line control circuit and a reference data line control circuit in a semiconductor device according to a fourth exemplary embodiment.
Figure 15:
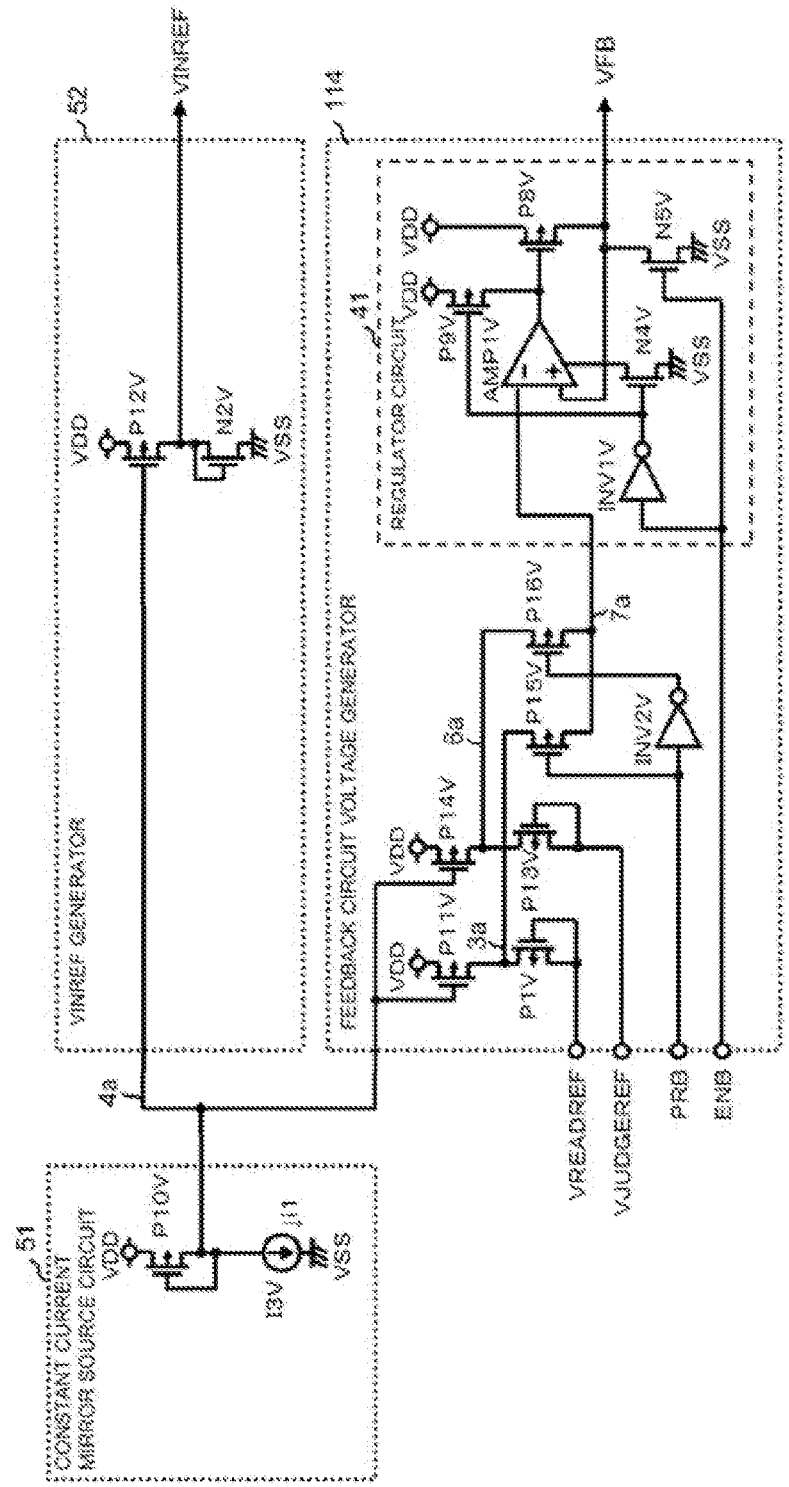
FIG. 15 is a circuit diagram illustrating a part of a data control circuit in the semiconductor device according to the fourth exemplary embodiment.

As illustrated in FIG. 15, in a semiconductor device illustrated in FIG. 14, a voltage generator 114 may be configured to supply the first voltage (V1) or a second voltage (V4), which is a sum of a second setting voltage (VJUDGEREF) set lower than the first setting voltage (VREADREF) and the absolute value (|VTP|) of the threshold voltage of the first transistor P1, to the power supply line 5. After the first control operation (for example, from timing T1 to T2 in FIG. 16), the semiconductor device may perform a third control operation (from timing T2 to T4 in FIG. 16) in which the first switch element P4 is set in a non-conductive state, the voltage generator 114 changes the voltage supplied to the power supply line 5 to the second voltage (V4), and the potential of the control line 4 is determined a predetermined time (from timing T3 to T4 in FIG. 16) after the timing when the first switch element P4 is set in a non-conductive state (at timing T2 in FIG. 16).

Figure 16:
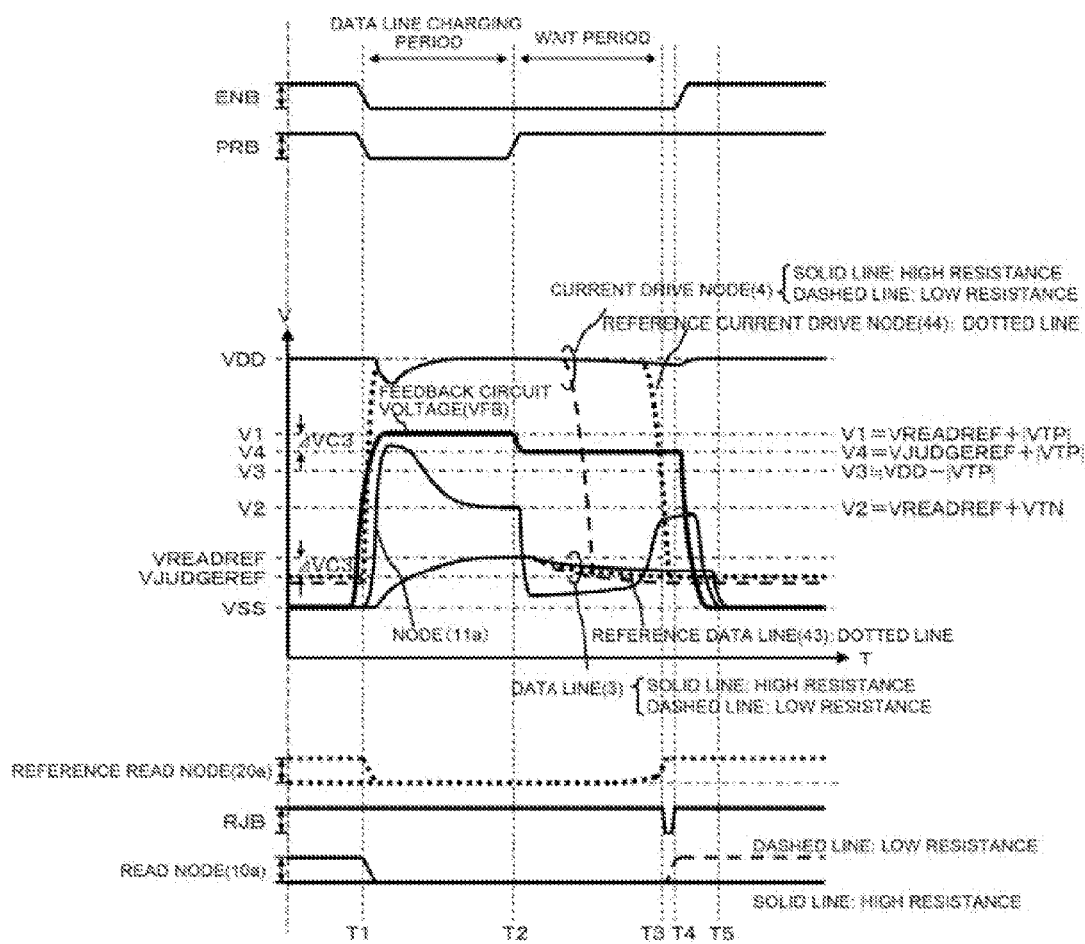
FIG. 16 is a waveform diagram illustrating an operation of the semiconductor device according to the fourth exemplary embodiment.

It is preferable that the semiconductor device illustrated in FIG. 14 further include a reference resistance element Rref2, a reference data line 43 coupled to the reference resistance element Rref2, a reference control line 44, and a reference control circuit 86 having substantially the same configuration as that of a control circuit 46 and controlling the reference data line 43 and the reference control line 44, instead of the data line 3 and the control line 4. In the first control operation (from timing T1 to T2 in FIG. 16), the reference data line 43 may also be charged with the first setting voltage (VREADREF) in the same way as the data line 3. In addition, in the third control operation (from timing T2 to T4 in FIG. 16), the predetermined time may be set on the basis of change of the potential of the reference control line 44 (timing T3 in FIG. 16 is the timing that corresponds to elapse of the predetermined time).

Figure 17:
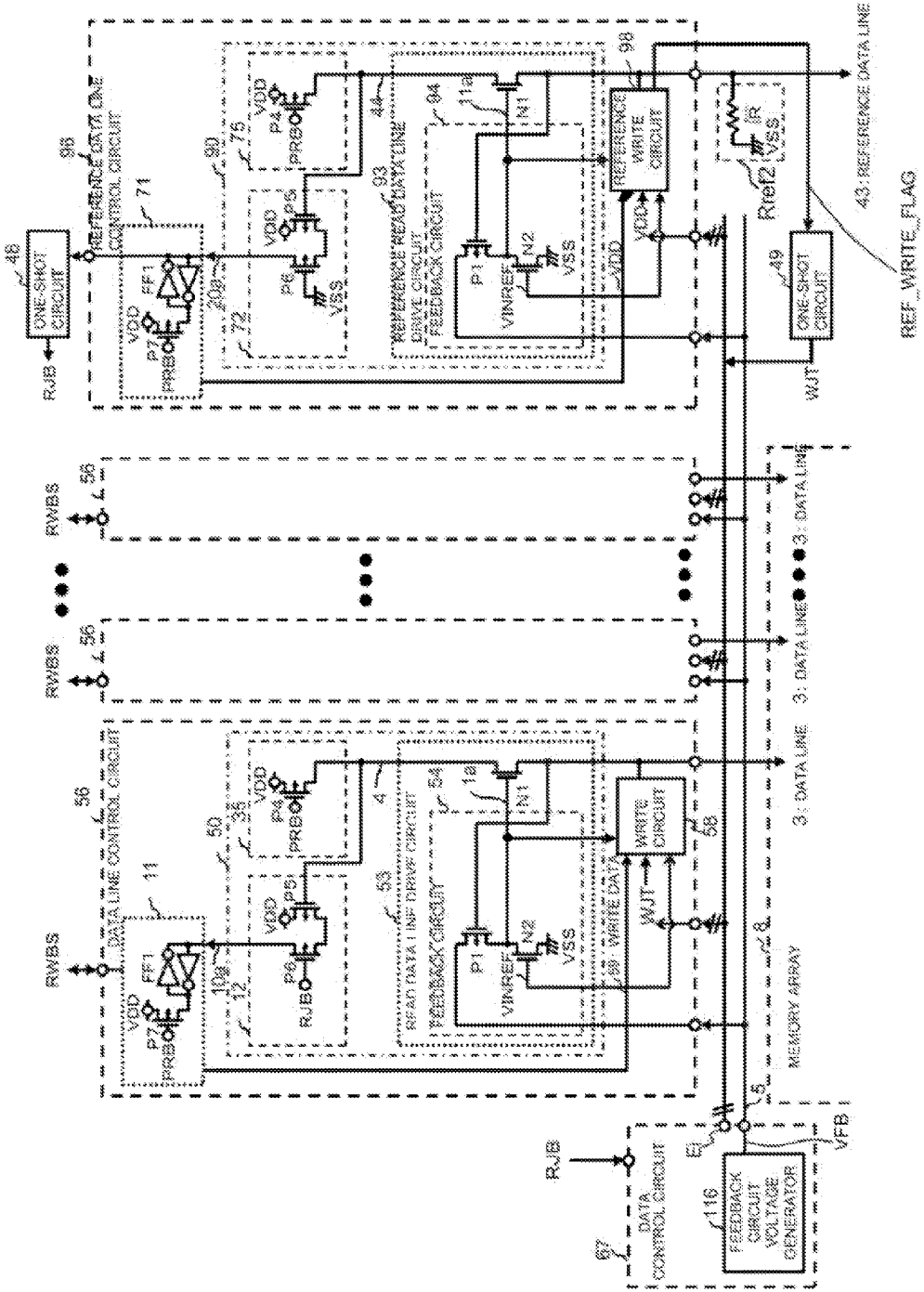
FIG. 17 is a circuit diagram illustrating a data line control circuit and a reference data line control circuit in a semiconductor device according to a fifth exemplary embodiment.
Figure 18:
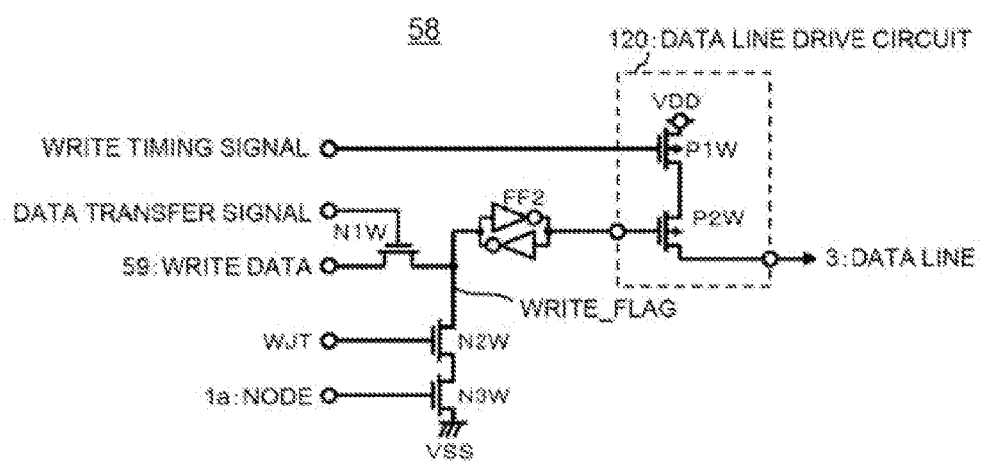
FIG. 18 is a circuit diagram illustrating a write circuit in the semiconductor device according to the fifth exemplary embodiment.

As illustrated in FIG. 18, a control circuit 56 in a semiconductor device illustrated in FIG. 17 may further include a write circuit 58 including a latch circuit FF2 storing write data and a data line drive circuit 120 applying a write voltage VDD to the data line 3 on the basis of the write data stored in the latch circuit FF2. The write circuit 58 may be coupled to a first node (1a in FIG. 17) where one of the source and the drain of the first transistor P1 is coupled to the gate of the second transistor N1. In addition, the write circuit 58 may invert the write data stored in the latch circuit FF2 on the basis of change of the potential of the first node (1a in FIG. 17) to inactivate the data line drive circuit 120.

Figure 20:
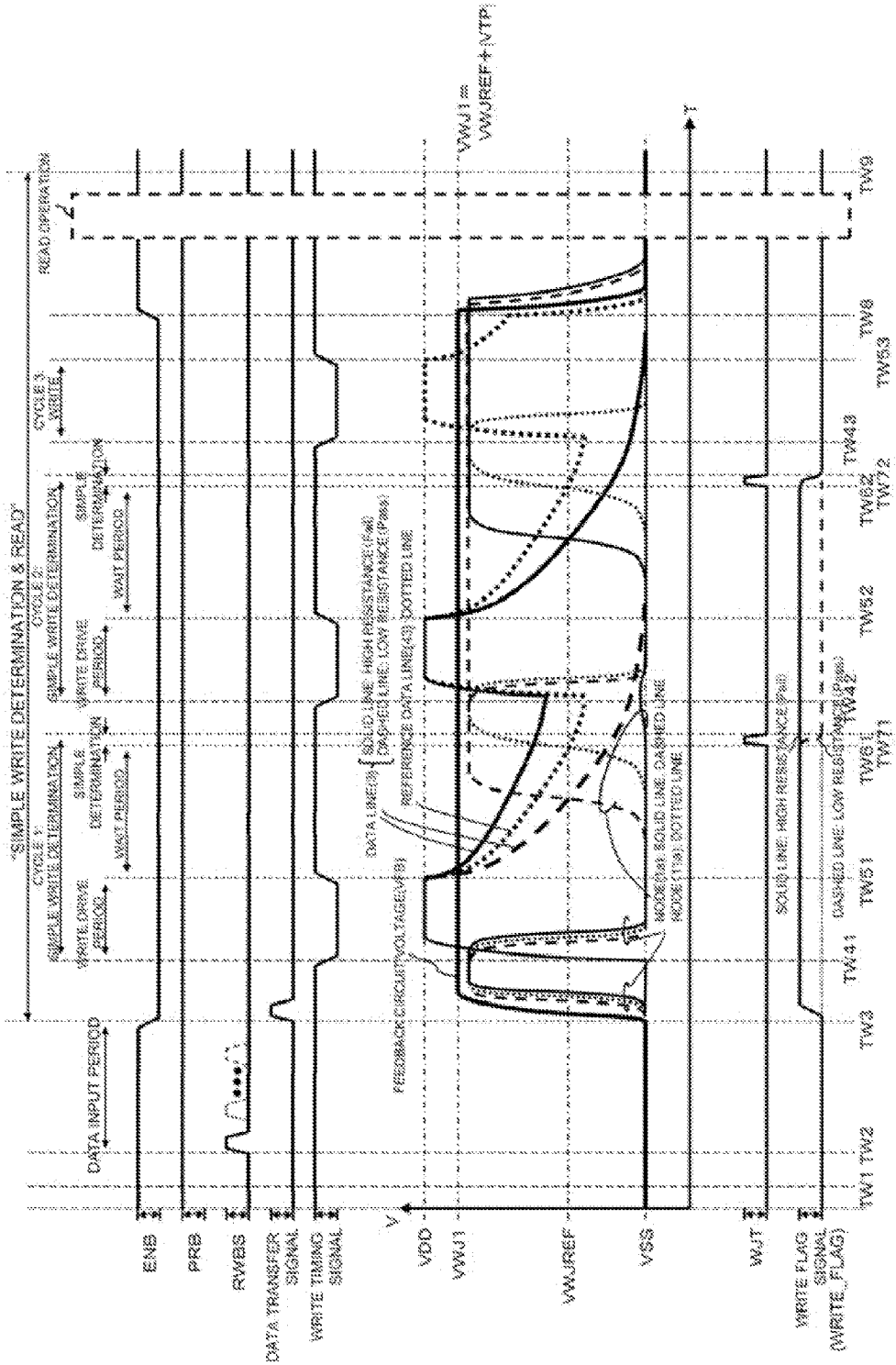
FIG. 20 is a waveform diagram illustrating an operation of the semiconductor device according to the fifth exemplary embodiment.

The semiconductor device illustrated in FIG. 17 may perform a fourth control operation (from timing TW41 to TW51 in FIG. 20, for example) in which, if the write data stored in the latch circuit (FF2 in FIG. 18) is compatible with a predetermined write operation (for example, in the case of a SET write operation as illustrated in FIG. 20, when the write data is "1," if the latch circuit (FF2 in FIG. 18) outputs "0," the write data can be considered as being compatible with the predetermined write operation), the data line drive circuit (120 in FIG. 18) applies the write voltage VDD to the data line 3 to write the data. In addition, after the fourth control operation, the semiconductor device may perform a fifth control operation (from timing TW51 to TW71 in FIG. 20, for example) in which the application of the write voltage VDD is stopped and the potential of the control line 4 is determined a predetermined time (at timing TW61 in FIG. 20) after the timing when the application of the write voltage VDD is stopped.

In the fifth control operation (from timing TW51 to TW71 in FIG. 20, for example), if change of the potential of the first node (1a in FIG. 17) is not detected and if the write data stored in the latch circuit (FF2 in FIG. 18) is not inverted, the fourth and fifth control operations may be repeated (from timing TW42 to TW72 and from timing TW43 to TW8 in FIG. 20, for example).

It is preferable that the semiconductor device illustrated in FIG. 17 further include a reference resistance element Rref2, a reference data line 43 coupled to the reference resistance element Rref2, a reference control line 44, and a reference control circuit 96 having substantially the same configuration as that of the control circuit 56 and controlling the reference data line 43 and the reference control line 44, instead of the data line 3 and the control line 4. In the fifth control operation (from timing TW51 to TW71 in FIG. 20, for example), the predetermined time may be set on the basis of change of the potential of a first reference node (11a in FIG. 17) in the reference control circuit 96 corresponding to the first node (1a in FIG. 17) in the control circuit 56 (timing TW61 in FIG. 20 is the timing that corresponds to elapse of the predetermined time).

Figure 21:
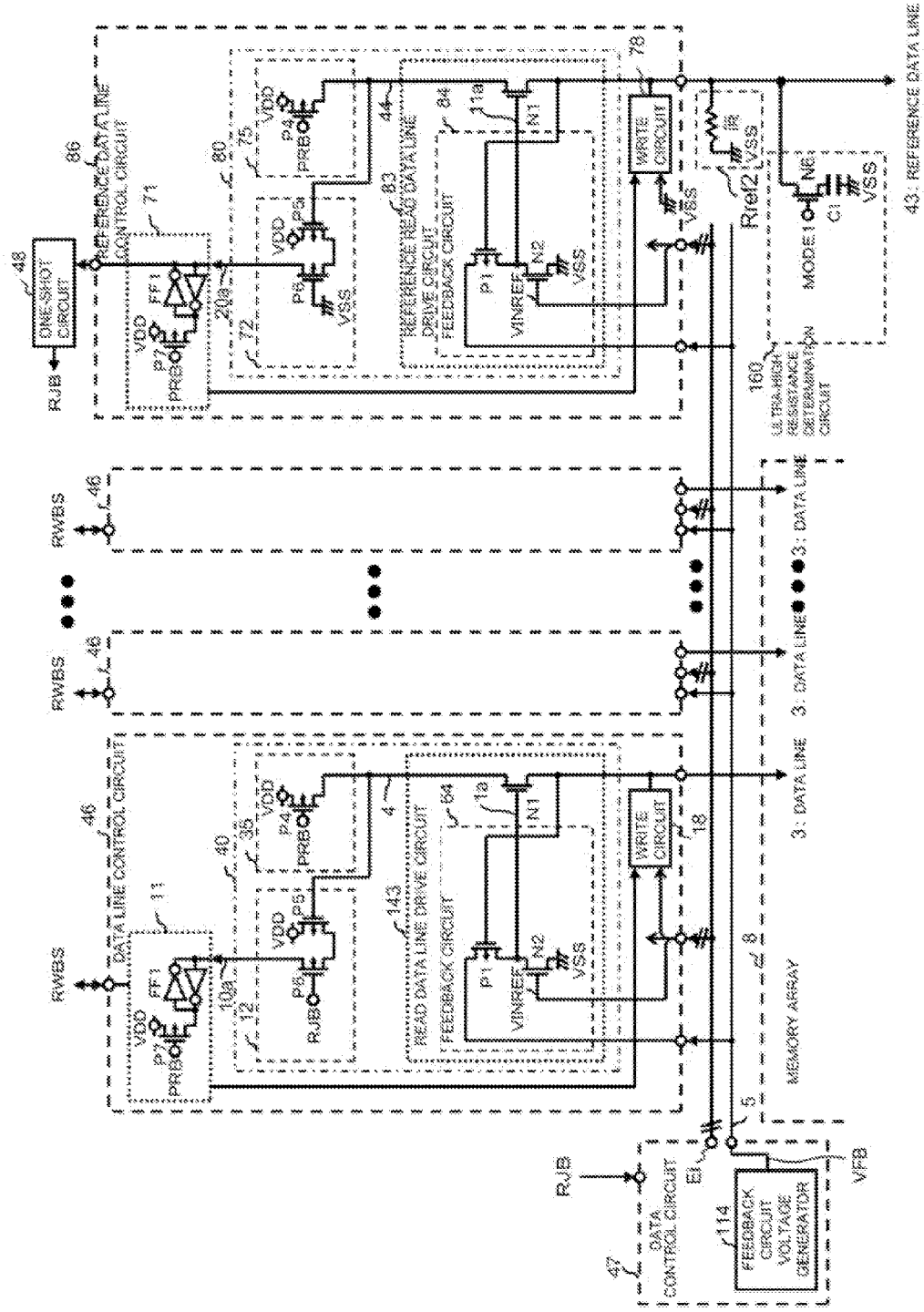
FIG. 21 is a circuit diagram illustrating a data line control circuit and a reference data line control circuit in a semiconductor device according to a sixth exemplary embodiment.

A semiconductor device illustrated in FIG. 21 may further include a second switch element N6 and a first capacitive element C1 having one end coupled to a reference data line 43 via a second switch element N6. The semiconductor device may be configured to be capable of switching modes between a first read operation (for example, a normal measurement mode) performed while the second switch element N6 is in a non-conductive state and a second read operation (for example, a ultra-high resistance measurement mode) performed while the second switch element N6 is in a conductive state.

Figure 11:
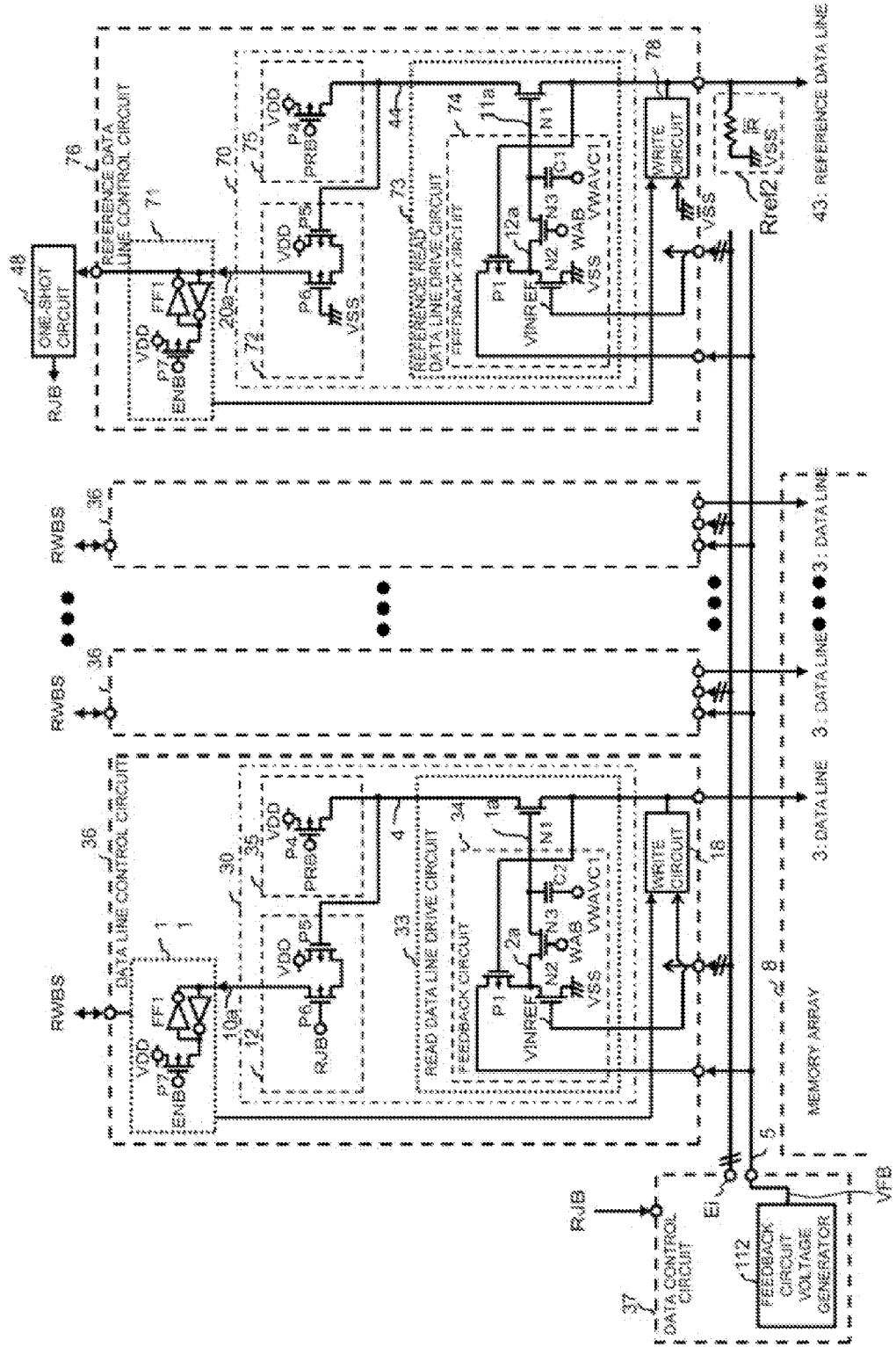
FIG. 11 is a circuit diagram illustrating a data line control circuit and a reference data line control circuit in the semiconductor device according to the third exemplary embodiment.

A semiconductor device according to another exemplary embodiment illustrated in FIG. 11 includes a resistive memory element 2, a data line 3 electrically coupled to the resistive memory element 2, a control line 4, a control circuit 36 including a feedback circuit 34 coupled to the data line 3 and controlling a potential of a second node 2a, a second transistor N1, and a first switch element P4 arranged between a first power supply VDD and the control line 4. The second transistor N1 has a gate coupled to an output node 1a of the feedback circuit 36, one of a source and a drain coupled to the data line 3, and the other one of the source and the drain coupled to the control line 4. In addition, the feedback circuit 34 includes a third switch element N3 between the second node 2a and the output node 1a of the feedback circuit.

The semiconductor device illustrated in FIG. 11 may include a second capacitive element C2 having one terminal coupled to the output node 1a of the feedback circuit 34 and the other terminal supplied with a voltage width control signal VWAVC1 whose amplitude can be controlled.

The semiconductor device illustrated in FIG. 11 may be configured to perform a first control operation (from timing T1 to T2 in FIG. 12) in which the first and third switch elements (P4 and N3) are set in a conductive state and the data line 3 is charged with the first setting voltage (VREADREF) and perform, after the first control operation, a sixth control operation (from timing T2 to T4 in FIG. 12) in which the first and third switch elements (P4 and N3) are set in a non-conductive state and the voltage width control signal VWAVC1 is decreased by a predetermined amplitude voltage (ΔVC1 in FIG. 12) to determine the potential decrease rate of the control line 4.

Figure 12:
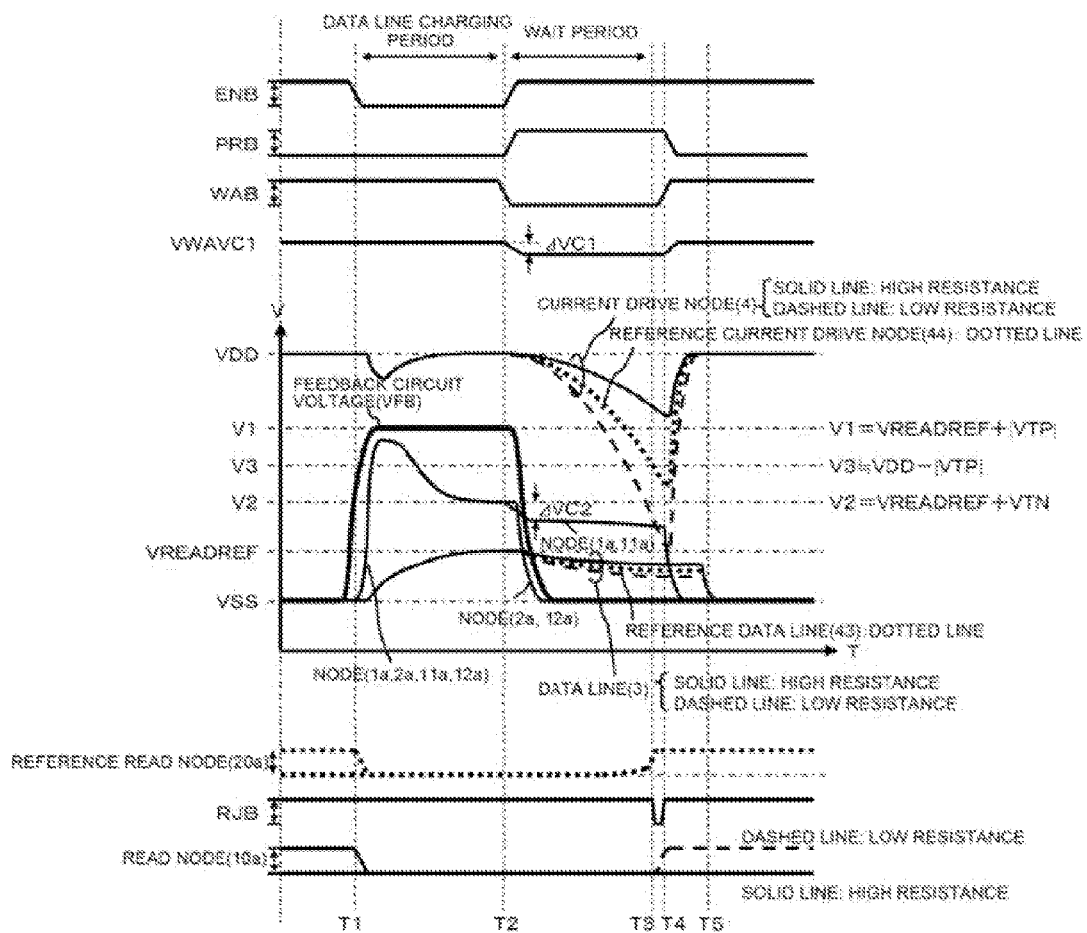
FIG. 12 is a waveform diagram illustrating an operation of the semiconductor device according to the third exemplary embodiment.

The semiconductor device illustrated in FIG. 11 may determine the potential decrease rate of the control line 4 in the sixth control operation by determining the potential of the control line 4 a predetermined time after the timing when the first and third switch elements (P4 and N3) are set in a non-conductive state (from timing T3 to T4 in FIG. 12).

It is preferable that the semiconductor device illustrated in FIG. 11 further include a reference resistance element Rref2, a reference data line 43 coupled to the reference resistance element Rref2, a reference control line 44, and a reference control circuit 76 having substantially the same configuration as that of the control circuit 36 and controlling the reference data line 43 and the reference control line 44, instead of the data 3 and the control line 4. In the first control operation (from timing T1 to T2 in FIG. 12), the reference data line 43 may also be charged with the first setting voltage (VREADREF) in the same way as the data line 3. In addition, in the sixth control operation (from timing T2 to T4 in FIG. 12), the predetermined time may be set on the basis of decrease of the potential of the reference control line 44 (timing T3 in FIG. 12 is the timing that corresponds to elapse of the predetermined time).

It is preferable that the feedback circuit 34 of the semiconductor device illustrated in FIG. 11 further include a first constant current element N2 and a first transistor P1 having a gate coupled to the data line 3, one of a source and a drain coupled to the first constant current element N2, and the other one of the source and the drain coupled to the power supply line 5.

It is preferable that the semiconductor device illustrated in FIG. 11 further include a voltage generator 112 supplying a voltage to the power supply line 5. In addition, it is preferable that, as illustrated in FIG. 5, the voltage generator 110 supply a first voltage (V1), which is a sum of a first setting voltage (VREADREF) applied to the data line 3 and an absolute value (|VTP|) of a threshold voltage of the first transistor P1V, to the power supply line 5.

In the semiconductor device illustrated in FIG. 11, it is preferable that the first constant current element in the control circuit 36 is configured by a third transistor N2. In addition, it is preferable that, as illustrated in FIG. 7, a first constant current source I3V and a fourth transistor N2V that forms a current mirror circuit with the third transistor N2 be arranged outside the control circuit 36. In addition, it is preferable that a current flowing through the third transistor N2 be controlled by the current mirror circuit on the basis of a current flowing through the first constant current source I3V.

Next, exemplary embodiments of the present disclosure will be described in detail with reference to the drawings.

First Exemplary Embodiment

Figure 3:
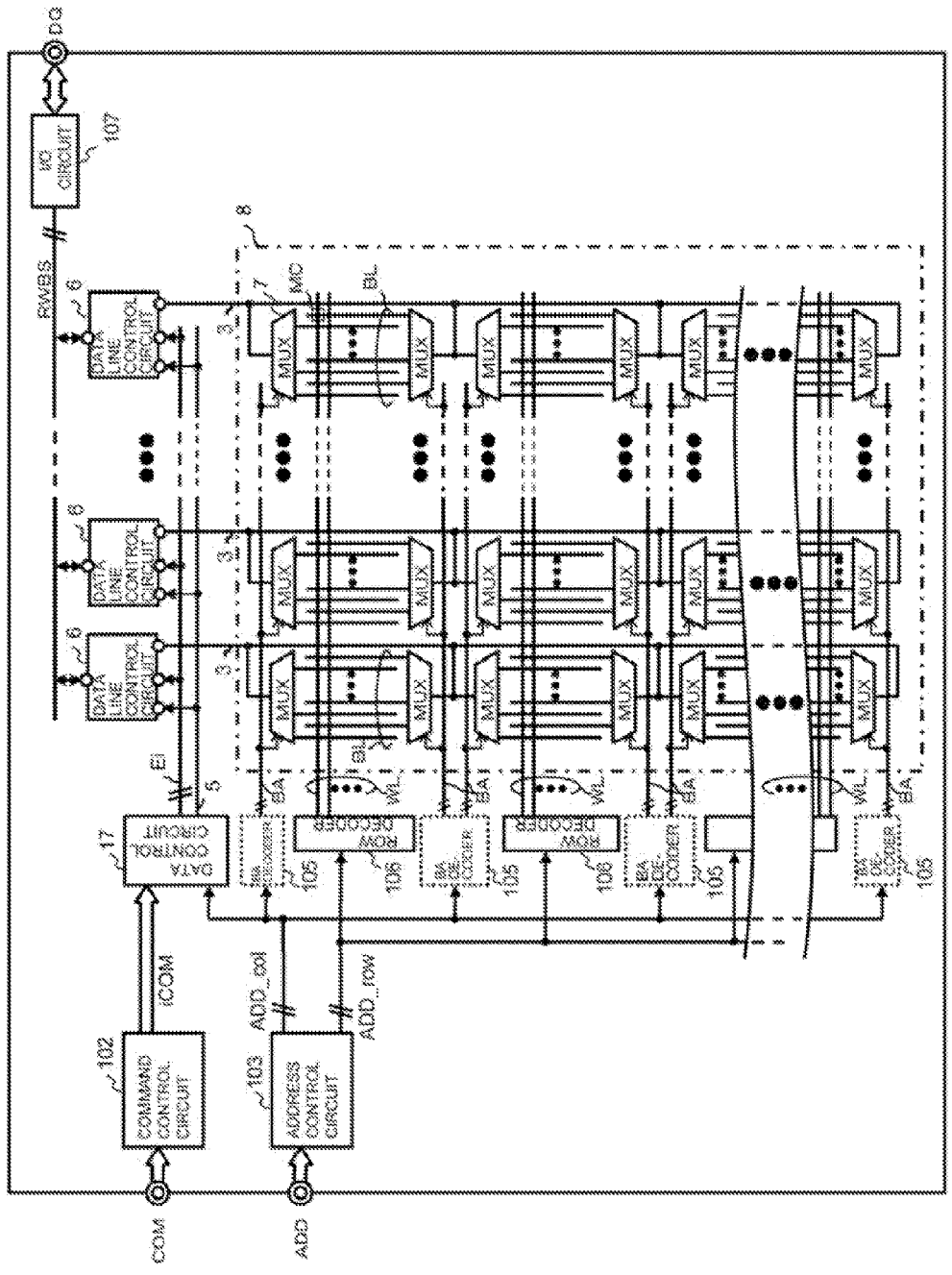
FIG. 3 is a block diagram illustrating an overall configuration of the semiconductor device according to the first exemplary embodiment.

A configuration according to a first exemplary embodiment will be described with reference to FIGS. 2 to 5. FIG. 3 is a block diagram illustrating an overall configuration of a semiconductor device 101. As illustrated in FIG. 3, a memory array 8 includes a plurality of bit lines BL, a plurality of word lines WL, and a plurality of multiplexers (MUX) 7. Each multiplexer 7 is coupled to a plurality of bit lines BL and has a function of selecting a single bit line BL and electrically coupling the selected single bit line BL to a corresponding data line 3 on the basis of a corresponding multiplexer address BA. A plurality of row decoders 106 and a plurality of BA decoders 105 are arranged along a first side (on the left side in FIG. 3) of the memory array 8. Each row decoder 106 selectively activates a single word line WL on the basis of an inputted row address ADD_row. The plurality of BA decoders 105 selectively activate multiplexer addresses BA on the basis of an inputted column address ADD_col. A plurality of data line control circuits 6 are aligned for the respective data lines 3 along a second side (on the upper side in FIG. 3) perpendicular to the first side of the memory array 8.

While a plurality of multiplexers 7 are coupled to a single data line 3, a single multiplexer 7 is selectively activated in a read/write operation. As a result, a single bit line BL is electrically coupled to the corresponding data line 3. Since the data lines 3 extend a long distance as illustrated in FIG. 3, the data lines 3 have large parasitic capacitance.

Figure 4:
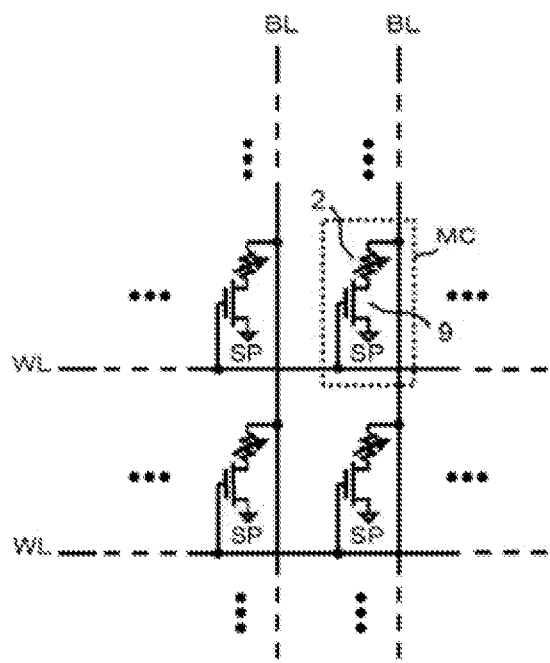
FIG. 4 is a circuit diagram illustrating resistive memory cells in the semiconductor device according to the first exemplary embodiment.

FIG. 4 is a circuit diagram illustrating a part of the memory array 8 in FIG. 3. A memory cell MC is arranged at each intersection of a bit line BL and a word line WL. Each memory cell MC is configured by a series connection of a resistive memory element 2 and a cell transistor 9 having one end coupled to a source plate SP. In a read operation, the source plate SP is supplied with VSS and the data line 3 is supplied with a voltage of a read reference signal VREADREF, which is a bit line read setting voltage. In this way, the voltage of the read reference signal VREADREF is applied across the resistive memory element 2 of the memory cell MC located at the intersection of a selected word line WL and a selected bit line BL.

Next, FIG. 2 is a block diagram illustrating a configuration of a data line control circuit 6 in the semiconductor device 101 according to the first exemplary embodiment. As illustrated in FIG. 2, the data line control circuit 6 includes; a data input/output circuit 11 inputting/outputting data from/to an I/O circuit (107 in FIG. 3) via a read/write bus RWBS: a write circuit 18 driving a corresponding data line 3 with a write voltage in a write operation, and a read circuit 10. The read circuit 10 includes a read data line drive circuit 13, a current drive circuit 15, and a read determination circuit 12. The current drive circuit 15 is coupled to a current drive node 4 and has a function of driving a current that flows through the current drive node 4. The read determination circuit 12 has a function of determining a resistance state of a memory cell MC in the memory array 8 on the basis of change of the voltage of the current drive node 4 and outputting the read data obtained by the determination to the data input/output circuit 11.

The read data line drive circuit 13 has the same configuration as that of the control circuit 6 in FIG. 1 referred to in the above description of the outlines of the exemplary embodiments. Namely, the read data line drive circuit 13 includes a feedback circuit 14 and an NMOS transistor N1. The feedback circuit 14 includes a PMOS transistor P1 and a constant current element I1. The constant current element I1 is an element for flowing a current having a current value i1. For example, the constant current element I1 can be configured by a resistor or a MOS transistor (configured by an NMOS transistor N2 in a second exemplary embodiment described below).

Figure 22A:
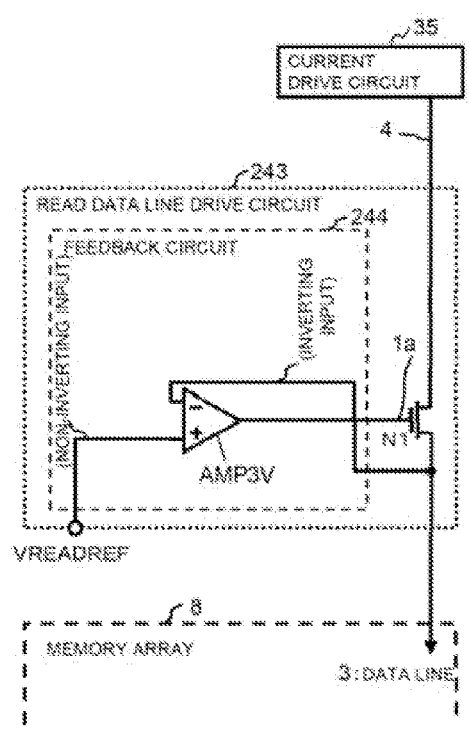
FIGS. 22A and 22B are circuit diagrams of a data line control circuit according to related techniques.
Figure 22B:
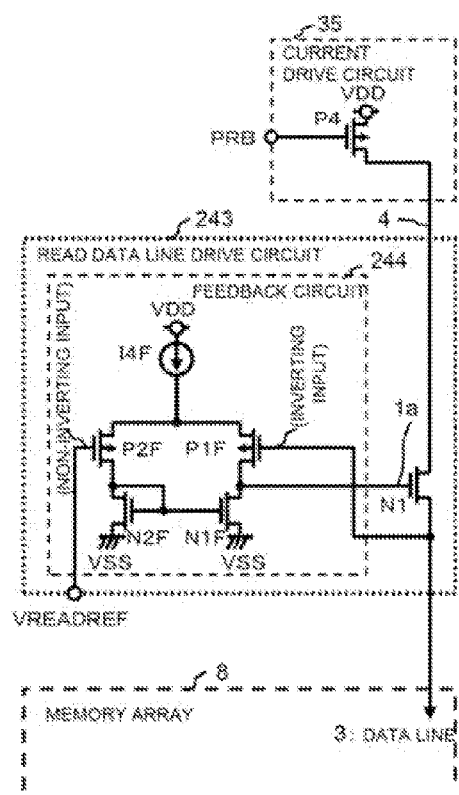

The feedback circuit 14 can be realized with a simpler configuration than that of the feedback circuit 244 according to the related techniques illustrated in FIGS. 22A and 22B. An operation principle of the feedback circuit 14 will be described below.

As illustrated in FIG. 2, the PMOS transistor P1, the constant current element I1, and the NMOS transistor N1 are coupled to each other as follows. The PMOS transistor P1 has a source coupled to a feedback circuit power supply line 5, a drain coupled to the constant current element I1, and a gate coupled to a corresponding data line 3. In addition, the NMOS transistor N1 has a drain coupled to the current drive node 4, a source coupled to the data line 3, and a gate (node 1a) coupled to a coupling node of the drain of the PMOS transistor and the constant current element I1.

Next, FIG. 5 is a circuit diagram illustrating a configuration of a feedback circuit voltage generator 110. The feedback circuit voltage generator 110 in FIG. 5 is a circuit included in a data control circuit 17 in FIG. 2. The feedback circuit voltage generator 110 has a function of inputting the read reference signal VREADREF and a control signal ENB and outputting a feedback circuit voltage VFB.

As illustrated in FIG. 5, the feedback circuit voltage generator 110 uses a PMOS transistor P1V and a constant current source I2V to generate a potential of a node 3a. The constant current source I2V is a constant current source that flows the same current it as does the constant current element I1. The PMOS transistor P1V is a transistor having the same channel length and channel width as those of the PMOS transistor P1. It is desirable that these PMOS transistors (P1 and P1V) be formed in the same process. By using the same process, the accuracy in matching the channel length and the channel width of the two PMOS transistors (P1 and P1V) can be improved, and the two PMOS transistors can have the same current drive capability.

The current value i1 is set to flow when a gate-source voltage VGS of the PMOS transistors (P1 and P1V) reaches a threshold voltage VTP. In this way, when the gate-source voltage VGS of the PMOS transistor P1V reaches the threshold voltage VTP, the potential of the node 3a reaches VREADREF+|VTP| (=V1). |VTP| represents an absolute value of the threshold voltage VTP. Namely, the potential of the node 3a is a sum of the read reference signal VREADREF and the absolute value |VTP| of the threshold voltage of the PMOS transistor P1.

A regulator circuit 41 in FIG. 5 includes a differential amplifier AMP1V, PMOS transistors (P8V and P9V), NMOS transistors (N4V and N5V), and an inverter circuit INV1V. When the control signal ENB is at a low level, the PMOS transistor P9V and the NMOS transistor N5V are turned off and the NMOS transistor N4V is turned on. In this state, the regulator circuit 41 is activated. With the differential amplifier AMP1V and the PMOS transistor P8V, the regulator circuit 41 outputs the voltage (VREADREF+|VTP|) of the node 3a to the feedback circuit voltage VFB with a large drive capability. In contrast, when the control signal ENB is at a high level, the regulator circuit 41 is inactivated. In this state, the regulator circuit 41 outputs VSS to the feedback circuit voltage supply VFB.

Next, an operation of charging the data line 3 performed in a read operation will be described with reference to FIG. 2. The principle of this charging operation is common to all the first to sixth exemplary embodiments.

As illustrated in FIG. 2, the current drive node 4 is supplied with a high voltage (for example, VDD) from the current drive circuit 15. When the control signal ENB is at a low level, the source of the PMOS transistor P1 is supplied with the voltage of VREADREF+|VTP|. Since the PMOS transistor P1 has a gate coupled to the data line 3, if the voltage of the data line 3 is lower than VREADREF, |VGS| (the absolute value of the gate-source voltage) of the PMOS transistor P1 is larger than |VTP|. Namely, the PMOS transistor P1 is strongly turned on. Accordingly, the voltage of the node 1a is increased to a high level and the NMOS transistor N1 is strongly turned on. As a result, the data line 3 is charged at high speed. When the voltage of the data line 3 reaches VREADREF as the charging progresses, |VGS| of the PMOS transistor P1 reaches |VTP|. In this state, since the current capability of the PMOS transistor P1 has the current value i1, which is the same as that of the constant current element I1, a steady state in which the potential of the node 1a does not change is reached. The potential of the node 1a in this state is a voltage V2 (V2=VREADREF+VTN), which is a sum of the voltage VREADREF of the data line 3 and a threshold voltage VTN of the NMOS transistor N1. In this way, when the voltage of the data line 3 reaches VREADREF, a steady state is reached and the charging operation is completed.

As described above, the read data line drive circuit 13 in FIG. 2 performs a feedback operation by causing the feedback circuit 14 to receive the voltage of the data line 3 and controlling the potential of the node 1a so that the data line 3 is charged until the voltage of the data line 3 reaches VREADREF. In this charging operation, when the voltage of the data line 3 reaches VREADREF, a steady state is obtained. Thus, an overshoot is not caused in the data line 3.

As described above, according to the first exemplary embodiment, the following advantageous effects can be obtained. In the same way as the read data line drive circuit 243 according to the related techniques illustrated in FIGS.

22A and 22B, each read data line drive circuit 13 according to the first exemplary embodiment can perform feedback control and can charge a corresponding data line 3 quickly and accurately up to the voltage of the reference signal VREADREF. In addition, since each feedback circuit 14 can be configured as a circuit with a simple configuration, a plurality of data line control circuits 6 can be arranged at shorter intervals. As a result, the number of memory cells MC to be read simultaneously in a single cell read operation can be increased, and high-speed data output can be realized.

Second Exemplary Embodiment

Configuration According to Second Exemplary Embodiment

Next, a configuration according to a second exemplary embodiment will be described with reference to FIGS. 6 to 8. The second exemplary embodiment differs from the first exemplary embodiment in that the constant current element I1 according to the first exemplary embodiment is replaced with an NMOS transistor N2, that a constant current mirror source circuit 51 and a VINREF generator 52 in FIG. 7 are newly added in a data control circuit 27, and that a feedback circuit voltage generator 112 is coupled to the constant current mirror source circuit 51. In addition, FIG. 6 according to the second exemplary embodiment illustrates specific circuit examples of the data input/output circuit 11, the read determination circuit 12, and the current drive circuit 15. In the second exemplary embodiment, constituent elements having substantially the same functions as those according to the first exemplary embodiment are denoted by the like reference characters, and redundant description thereof will be omitted.

As illustrated in FIG. 6, the NMOS transistor N2 is used in place of the constant current element I1 according to the first exemplary embodiment. The NMOS transistor N2 has a gate supplied with a reference voltage VINREF outputted from the data control circuit 27. Next, the data control circuit 27 will be described in detail with reference to FIG. 7. The data control circuit 27 includes the constant current mirror source circuit 51, the VINREF generator 52, and the feedback circuit voltage generator 112. A reference character "Ei" in FIG. 6 represents control signals outputted from the data control circuit 27. For example, the control signals Ei include the reference voltage VINREF in FIG. 7. The constant current mirror source circuit 51 includes a constant current source I3V having the current value i1 and a PMOS transistor P10V that are coupled in series with each other between the power supply VDD) and the ground VSS. The PMOS transistor P10V has a gate and a drain coupled to each other, and the current i1 flows through the PMOS transistor P10V.

The VINREF generator 52 in FIG. 7 includes a PMOS transistor P12V and an NMOS transistor N2V that are coupled in series with each other between the power supply VDD and the ground VSS. In addition, the PMOS transistor P12V has a gate coupled to the gate of the PMOS transistor P10V. These two PMOS transistors (P10V and P12V) form a current mirror circuit. The two PMOS transistors (P10V and P12V) have the same channel length and channel width. With this current mirror circuit configuration, the current i1 also flows through the PMOS transistor P12 and the NMOS transistor N2V.

In addition, the NMOS transistor N2V has a gate and a drain that are coupled to each other, and from this coupling node, the VINREF generator 52 outputs the reference voltage VINREF. An interconnect of the reference voltage VINREF is coupled to the gate of an NMOS transistor N2 in each data line control circuit 26. In this way, the NMOS transistor N2V in the VINREF generator 52 forms a current mirror circuit with an NMOS transistor N2 in each data line control circuit 26. The NMOS transistor N2V and each MOS transistor N2 have the same channel length and channel width. It is desirable that these NMOS transistors (N2V and N2) be formed in the same process. By using the same process, the accuracy in matching the channel length and the channel width of the two NMOS transistors (N2 and N2V) can be improved, and the two NMOS transistors can have the same current drive capability. With the above current mirror circuit configuration, the current i1 also flows through an NMOS transistor N2 in each data line control circuit 26.

Next, the feedback circuit voltage generator 112 in FIG. 7 includes a PMOS transistor P11V in place of the constant current source I2V in the feedback circuit voltage generator 110 (the first exemplary embodiment) in FIG. 5. The PMOS transistor P11V has a gate coupled to the gate of the PMOS transistor P10V in the constant current mirror source circuit 51. These two PMOS transistors (P10V and P11V) form a current mirror circuit. The two PMOS transistors (P10V and P11V) are formed to have the same channel length and channel width. With this current mirror circuit configuration, the current i1 also flows through the PMOS transistor P11V. In this way, the potential of the node $3a$ is set to be VREADREF+|VTP|.

Next, the current drive circuit 15 in FIG. 6 will be described. The current drive circuit 15 includes a PMOS transistor P3 having a gate coupled to a reference voltage VIPREF (see FIG. 8), which will be described in detail below, and a PMOS transistor P4 having a gate coupled to a control signal PRB. The reference voltage VIPREF and the control signal PRB are some of the data control signals Ei outputted from the data control circuit 27. The PMOS transistor P4 supplies the voltage VDD to the current drive node 4 with a large drive capability while the control signal PRB is at a low level.

Figure 8:
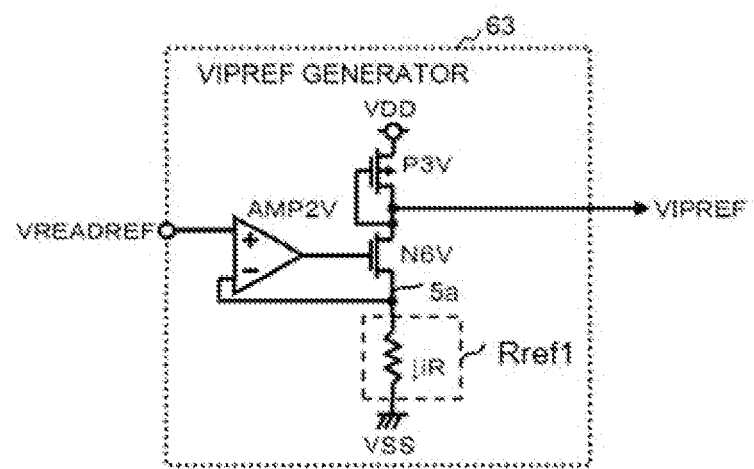
FIG. 8 is a circuit diagram illustrating a part of the data control circuit in the semiconductor device according to the second exemplary embodiment.

In contrast, the reference voltage VIPREF is generated by a VIPREF generator 63 arranged in the data control circuit 27 in FIG. 8. As illustrated in FIG. 8, the VIPREF generator 63 includes a differential amplifier AMP2V, a PMOS transistor P3V, an NMOS transistor N6V, and a reference resistor Rref1. The PMOS transistor P3V, the NMOS transistor N6V, and the reference resistor Rref1 are coupled in series with each other between the voltage supply VDD and the ground VSS. A node $5a$, which is a coupling node of the NMOS transistor N6V and the reference resistor Rref1, is coupled to an inverting input terminal of the differential amplifier AMP2V. In addition, a non-inverting input terminal of the differential amplifier AMP2V is supplied with the voltage of the read reference signal VREADREF. In addition, an output terminal of the differential amplifier AMP2V is coupled to a gate of the NMOS transistor N6V. With this configuration, the potential of the node $5a$ is controlled to be equal to the potential of the read reference signal VREADREF. In this way, a current iR represented by formula (1) flows through the reference resistor Rref1.

$$iR = VREADREF/Rref1 \qquad \text{formula (1)}$$

The current iR represented by formula (1) also flows through the PMOS transistor P3V. The PMOS transistor P3V has a gate and a drain coupled to each other, and from this coupling node, the VIPREF generator 63 outputs the reference voltage VIPREF. An interconnect of the reference voltage VIPREF is coupled to the gate of a PMOS transistor P3 in each data line control circuit 26. The PMOS transistor P3V in the VIPREF generator 63 forms a current mirror circuit with a PMOS transistor P3 in each data line control circuit 26. The PMOS transistor P3V and the PMOS transistor P3 are configured to have the same channel length and channel width. It is desirable that the PMOS transistors (P3V and P3) be formed in the same process. By using the same process, the accuracy in matching the channel length and the channel width of the two PMOS transistors (P3V and P3) can be improved, and the two PMOS transistors can have the same current drive capability. Thus, both the PMOS transistor P3V and the PMOS transistor P3 have a function of flowing the current iR. With this current mirror circuit configuration, the current iR also flows through the PMOS transistor P3. Thus, the current flowing through the current drive node 4 is a sum of the current flowing via the PMOS transistor P4 and the current iR flowing via the PMOS transistor P3.

Next, the read determination circuit 12 in FIG. 6 will be described. As illustrated in FIG. 6, the read determination circuit 12 includes a PMOS transistor P5 having a gate coupled to the current drive node 4 and a PMOS transistor P6 having a gate coupled to a control signal RJB, the PMOS transistors P5 and P6 being coupled in series with each other. The control signal RJB is one of the data control signals Ei. When the PMOS transistor P5 and the PMOS transistor P6 are set in a conductive state, the power supply VDD is applied to a node 10a (read node).

With this configuration, the read determination circuit 12 operates as follows. When the control signal RJB is at a low level, if the current drive node 4 is lower than VDD−|VTP|, the PMOS transistor P5 is turned on and outputs VDD to the node 10a. In contrast, when the control signal RJB is at a low level, if the current drive node 4 is higher than VDD−|VTP|, the PMOS transistor P5 is turned off. Thus, no voltage is outputted to the node 10a.

Next, the data input/output circuit 11 in FIG. 6 will be described. As illustrated in FIG. 6, the data input/output circuit 11 includes a latch circuit FF1 latching read data and write data and a PMOS transistor P7 having a gate coupled to the control signal PRB. The latch circuit FF1 has one terminal coupled to a drain of the PMOS transistor P7 and the other terminal coupled to the node 10a (read node). In addition, the PMOS transistor P7 has a source coupled to the power supply VDD. The data input/output circuit 11 has a function of inputting/outputting write/read data from/to the read/write bus RWBS (not illustrated in FIG. 6).

Operation According to Second Exemplary Embodiment

Figure 9:
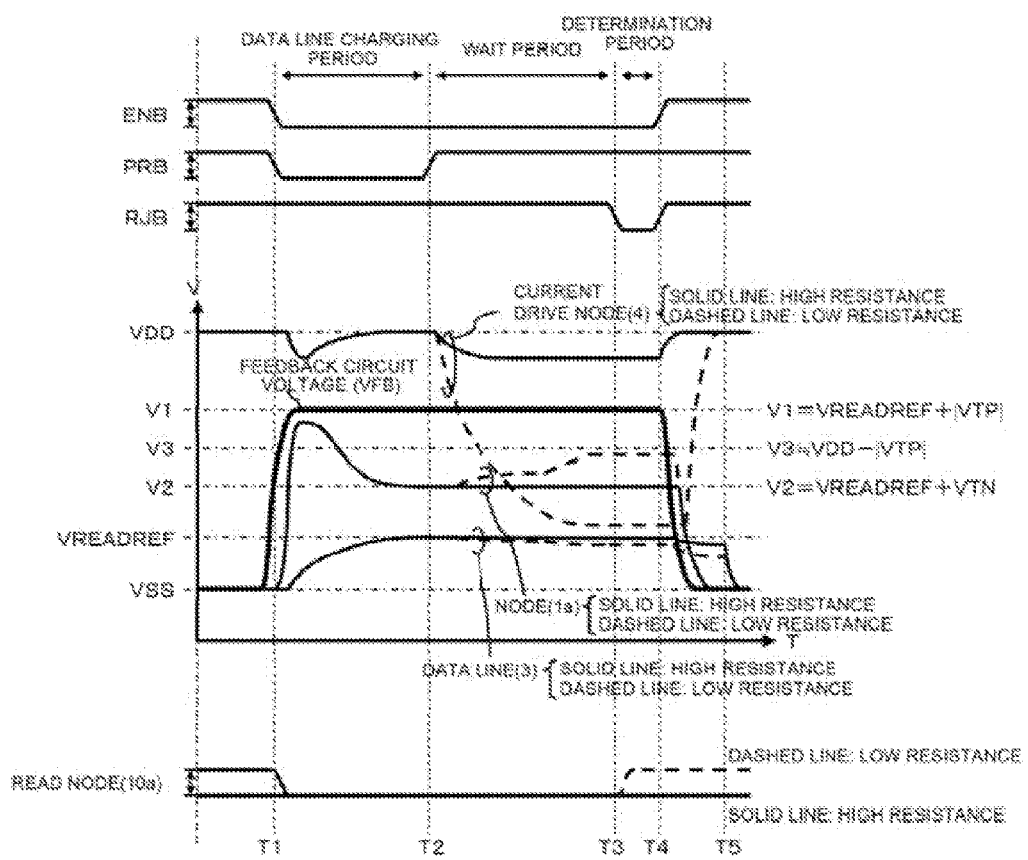
FIG. 9 is a waveform diagram illustrating an operation of the semiconductor device according to the second exemplary embodiment.

Next, an operation according to the second exemplary embodiment will be described with reference to FIG. 9. FIG. 9 is a waveform diagram illustrating a read operation of the semiconductor device according to the second exemplary embodiment. In the upper portion in FIG. 9, the voltages of the control signals ENB, PRB, and RJB are illustrated. In the middle portion in FIG. 9, the voltages of the data line 3, the current drive node 4, the node 1a, and the feedback circuit power supply VFB are illustrated. In addition, the voltages of the data line 3, the current drive node 4, and the node 1a are denoted by solid lines when a corresponding resistive memory element 2 is in a high resistance state. However, these voltages are denoted by dashed lines when a corresponding resistive memory element 2 is in a low resistance state. In the lower portion in FIG. 9, the voltage of the node 10a (read node) is illustrated. The voltage of the node 10a (read node) is also denoted by a solid line and a dashed line when a corresponding resistive memory element 2 is in a high resistance state and a low resistance state, respectively.

In FIG. 9, the period from timing T1 to T5 is a read operation period. In this period, a word line and a multiplexer address BA corresponding to a data-read-target memory cell MC are activated.

The period from timing T1 to T2 in FIG. 9 is a charging period of a data line 3. In this charging period of the data line 3, a selected bit line BL coupled to the read-target memory cell MC is also charged. Since the operation of charging the data line 3 has already been described in the first exemplary embodiment, redundant description will be omitted.

From timing T1 to T2, the control signal ENB is set to a low level to activate the feedback circuit voltage generator 112 and output the voltage VFB as the voltage V1 (=VREADREF+|VTP|). In addition, the control signal PRB is set to a low level to turn on the PMOS transistor P4 and drive the current drive node 4 with the voltage VDD. In the period from timing T1 to T2 in FIG. 9, while the voltage of the data line 3 is lower than VREADREF, since the PMOS transistor P1 is strongly turned on, the voltage of the node 1a reaches close to the source voltage of the PMOS transistor P1 (namely, close to the voltage V1 of the feedback circuit power supply). However, as the charging progresses and the voltage of the data line 3 is increased, the voltage of the node 1a is gradually decreased. When the data line 3 is charged and increased up to the voltage VREADREF, the node 1a is brought in a steady state at the voltage V2. In addition, since the data line 3 is little affected by the resistance value of the resistive memory element 2, the data line 3 is maintained at the voltage VREADREF.

Since the control signal PRB is changed to a low level at timing T1, the PMOS transistor P7 is turned on and the latch circuit FF1 is reset. As a result, the node 10a (read node) is initialized to a low level.

Next, the period from timing T2 to T3 is a wait period. In this period, since the control signal ENB is maintained at a low level, the feedback circuit voltage generator 112 is still active and the feedback circuit 24 continues to perform a feedback operation. Without this feedback operation, the voltage of the data line 3 would be decreased from VREADREF by the charges that have flowed to the memory cell MC. However, with the feedback operation, the charges that have flowed to the memory cell MC are supplemented from the current drive node 4 and the data line 3 is maintained at the voltage VREADREF.

In addition, in this period, since the control signal PRB is set to a high level to turn off the PMOS transistor P4 in the current drive circuit 15. Namely, the current supplied to the current drive node 4 is only the current iR that flows via the PMOS transistor P3. Thus, if a current iMC flowing through the memory cell MC is larger than the current value iR (iMC>iR), the charges of the current drive node 4 are decreased. Since the current drive node 4 has parasitic capacitance smaller than that of the data line 3, if the charges of the current drive node 4 are decreased, the voltage of the current drive node 4 is quickly decreased. The above condition iMC>iR is satisfied when the resistance value of the resistive memory element 2 is smaller than that of the reference resistor Rref1 (namely, when the resistive memory element 2 is in a low resistance state). As illustrated in the period from timing T2 to T3 in FIG. 9, the voltage (dashed line) of the current drive node 4 is quickly decreased close to the voltage VREADREF from timing T2. In addition, in the period from timing T2 to T3, the voltage (dashed line) of the node 1a is increased from the voltage V2 in the steady state, to strongly turn on the NMOS transistor N1 and supply charges to the data line 3 from the current drive node 4.

In contrast, if the current iMC flowing through the memory cell MC is smaller than the current value iR (iMC<iR), since the number of charges flowing to the memory cell MC is small, it is only sufficient to supply a smaller number of charges from the current drive node 4. Thus, the current drive node 4 is maintained at a high voltage. The above condition iMC<iR is satisfied when the resistance value of the resistive memory element 2 is larger than that of the reference resistor Rref1 (namely, when the resistive memory element 2 is in a high resistance state). As illustrated in the period from timing T2 to T3 in FIG. 9, the current drive node 4 (solid line) is maintained at a high voltage. In addition, in the period from timing T2 to T3, the voltage (solid line) of the node 1a is maintained at the voltage V2 in the steady state.

As described above, in the second exemplary embodiment, the voltage of the current drive node 4 changes depending on whether the current iMC flowing through the memory cell MC is larger or smaller than iR (namely, whether the resistance value of the resistive memory element 2 is larger or smaller than that of the reference resistor Rref1).

Next, the period from timing T3 to T4 is a determination period. In this period, the control signal RJB is set to a low level in one shot. In this period, the resistance state of the resistive memory element 2 is determined by the read determination circuit 12. If the resistive memory element 2 is in a low resistance state, the node 10a (read node) changes from a low level to a high level (dashed line) and data is latched in the latch circuit FF1. In contrast, if the resistive memory element 2 is in a high resistance state, the node 10a (read node) remains at a low level (solid line) and the output from the latch circuit FF1 does not change.

At timing T4, the control signal ENB is set to a high level (inactivated) to inactivate the feedback circuit voltage generator 112 and set the feedback circuit power supply VFB to VSS. Next, at timing T5, the data line 3 is reset to VSS by the write circuit (18 in FIG. 6) and the like. In this way, the read operation is completed.

As described above, the second exemplary embodiment provides the same advantageous effects as those provided by the first exemplary embodiment. In the same way as the read data line drive circuit 243 according to the related techniques illustrated in FIGS. 22A and 22B, each read data line drive circuit 23 can perform feedback control and can charge a corresponding data line 3 quickly and accurately up to the voltage of the reference signal VREADREF. In addition, according to the second exemplary embodiment, since each feedback circuit 24 can be configured as a circuit with a simple configuration, a plurality of data line control circuits 26 can be arranged at shorter intervals. As a result, the number of memory cells MC to be read simultaneously in a single cell read operation can be increased, and high-speed data output can be realized.

In addition, according to the second exemplary embodiment, the current flowing through the feedback circuit voltage generator 112 and the VINREF generator 52 is controlled by the current mirror circuit, using the current i1 of the constant current source I3V. Thus, when a steady state is reached in the charging period of a data line 3, since the value of the current flowing through the PMOS transistor P1 and the NMOS transistor N2 reaches i1 generated by the single constant current source I3V, the charged voltage of the data line 3 can accurately match the read reference signal VREADREF. Namely, the accuracy of the voltage with which the data line 3 is charged can be increased.

In addition, according to the second exemplary embodiment, by changing the voltage of a current drive node 4 on the basis of the current flowing through a corresponding data line 3 in the wait period and by detecting change of the voltage of the current drive node 4 in the determination period, the resistance state of a corresponding resistive memory element 2 coupled to the data line 3 can be detected with a circuit having a simple configuration. Namely, according to the second exemplary embodiment, not only each data line 3 can be charged quickly and accurately, but also the resistance state of each resistive memory element 2 can be read with a circuit having a simple configuration.

Third Exemplary Embodiment

Configuration According to Third Exemplary Embodiment

Figure 10:
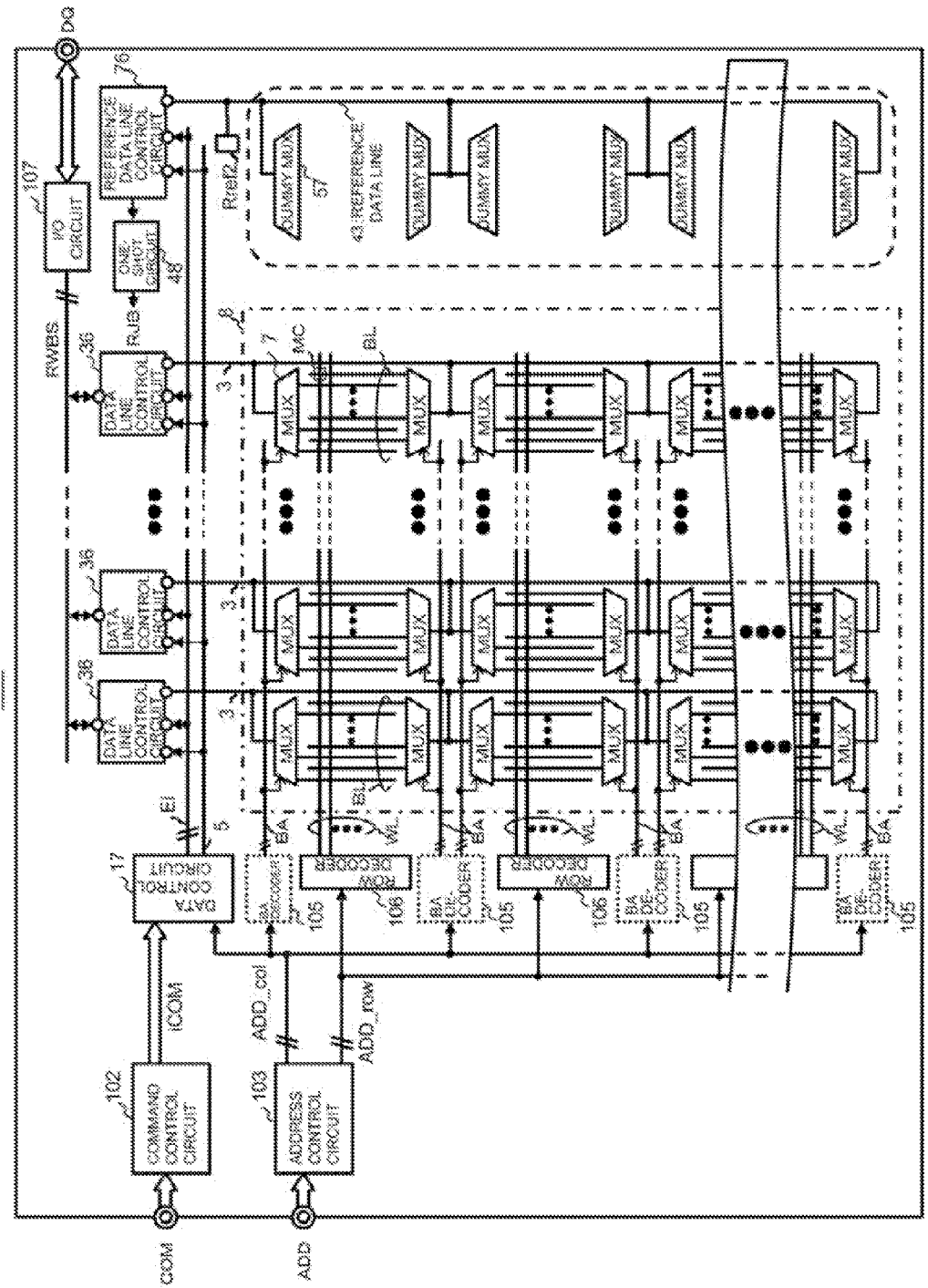
FIG. 10 is a block diagram illustrating an overall configuration of a semiconductor device according to a third exemplary embodiment.

Next, a configuration according to a third exemplary embodiment will be described with reference to FIGS. 10 and 11. FIG. 10 is a block diagram illustrating an overall configuration of a semiconductor device 301 according to the third exemplary embodiment. When FIG. 10 is compared with FIG. 3, it becomes clear that a reference data line 43, a reference data line control circuit 76, a reference resistor Rref2, and a one-shot circuit 48 are newly added in FIG. 10. Of the constituent elements other than these elements, those having substantially the same functions as those according to the first or second exemplary embodiment are denoted by the like reference characters, and redundant description will be omitted.

The reference data line 43 has substantially the same length as that of each data line 3 and is coupled to dummy multiplexers (dummy MUX) 57 corresponding to the multiplexers (MUX) 7 coupled to each data line 3. In this way, the interconnect capacitance of the reference data line 43 is set to be equal to that of each data line 3.

Next, a data line control circuit 36 and the reference data line control circuit 76 according to the third exemplary embodiment will be described in detail with reference to FIG. 11. FIG. 11 is a circuit diagram illustrating the data line control circuit 36 and the reference data line control circuit 76 in the semiconductor device 301 according to the third exemplary embodiment. When the data line control circuit 36 in FIG. 11 is compared with the data line control circuit 26 in FIG. 6, it becomes clear that a feedback circuit 34 in the data line control circuit 36 and a current drive circuit 35 have a different configuration.

First, the feedback circuit 34 newly includes an NMOS transistor N3 between a node 2a, which is a coupling node of the drain of the PMOS transistor P1 and the drain of the NMOS transistor N2, and the gate (node 1a) of the NMOS transistor N1. In addition, the feedback circuit 34 newly includes a second capacitive element C2 having one terminal coupled to the node 1a. A control signal WAB is supplied to a gate of the NMOS transistor N3. In addition, the second capacitive element C2 has the other terminal supplied with a control signal VWAVC1 (voltage width control signal).

In addition, the current drive circuit 35 in FIG. 11 does not include the PMOS transistor P3 in FIG. 6 but is configured by the PMOS transistor P4 alone.

In FIG. 11, the reference data line control circuit 76 includes circuit blocks each having the same configuration as that of the circuit blocks in the data line control circuit 36. More specifically, a reference read data line drive circuit 73, a current drive circuit 75, a reference read determination circuit 72, and a data input/output circuit 71 in the reference data line control circuit 76 have the same configurations as those of a read data line drive circuit 33, the current drive circuit 35, the read determination circuit 12, and the data input/output circuit 11 in the data line control circuit 36, respectively. The circuit elements included in the reference data line control circuit 76 are denoted by the same reference characters of the respective circuit element in the data line control circuit 36.

The reference data line control circuit 76 differs from each data line control circuit 36 in that a PMOS transistor P6 in the reference read determination circuit 72 has a gate coupled to VSS and that a data control signal coupled to a write circuit 78 is fixed at VSS so that writing of the reference data line 43 is not performed. Since only the difference between the reference data line control circuit 76 and each data line control circuit 36 is an input signal, the reference data line control circuit 76 can be arranged in approximately the same way as each data line control circuit 36. Thus, it is preferable that a single reference data line control circuit 76 be arranged next to the aligned data line control circuits 36.

In addition, the reference resistor Rref2 is coupled between the reference data line 43 and the ground VSS. When the reference data line 43 is at the voltage VREADREF, the current iR flows through the reference resistor Rref2.

The one-shot circuit 48 has a function of generating a one-shot signal in a determination period (in the period from timing T3 to T4 in FIG. 12), which will be described in detail below. When a node 20a (reference read node) is changed from a low level to a high level, in response to a rising edge thereof, the one-shot circuit 48 outputs a one-shot low signal as the control signal RJB. The control signal RJB is supplied to the gate of the PMOS transistor P6 in the read determination circuit 12 in each data line control circuit 36 and to a data control circuit 37. The data control circuit 37 according to the third exemplary embodiment includes the feedback circuit voltage generator 112 according to the second exemplary embodiment in FIG. 6.

Operation According to Third Exemplary Embodiment

Figure 13:
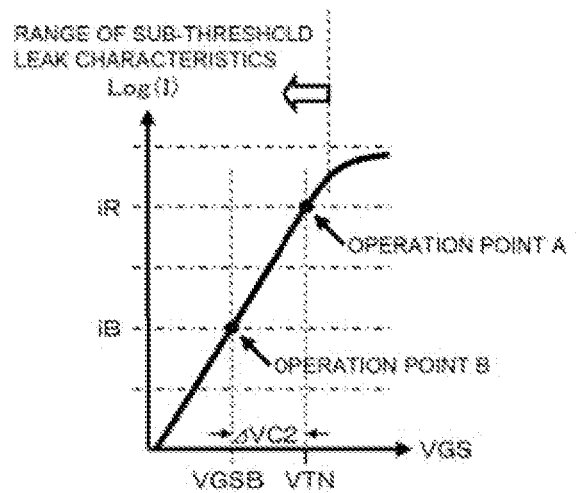
FIG. 13 is a diagram for illustrating an operation of the semiconductor device according to the third exemplary embodiment.

Next, an operation according to the third exemplary embodiment will be described with reference to FIGS. 12 and 13. FIG. 12 is a waveform diagram illustrating a read operation of the semiconductor device 301 according to the third exemplary embodiment. In the upper portion in FIG. 12, the voltages of the control signals ENB, PRB, WAB, and VWAVC1 are illustrated. In the middle portion in FIG. 12, the voltages of the data line 3, the reference data line 43, the current drive node 4, a reference current drive node 44, the node 1a, the node 2a, a node 11a, a node 12a, and the feedback circuit power supply VFB are illustrated. In addition, in the lower portion in FIG. 12, the voltage of the node 20a (reference read node) and the node 10a (read node) are illustrated. Among these waveforms, those corresponding to a memory cell in a high resistance state are denoted by solid lines, those corresponding to a memory cell in a low resistance state are denoted by dashed lines, and those relating to the reference control circuit are denoted by dotted lines.

As in the second exemplary embodiment, a word line WL and a multiplexer address BA corresponding to a data-read-target memory cell MC are active in the period from timing T1 to T5 in FIG. 12.

The period from timing T1 to T2 is a charging period of the data line 3. In this period, since the control signal WAB is at a high level and the NMOS transistor N3 is set in a conductive state, the same charging operation as that according to the second exemplary embodiment is performed. In addition, in the third exemplary embodiment, the reference data line 43 is also charged with the same voltage VREADREF as is the data line 3. In addition, at timing T1, since the control signal ENB is changed from a high level to a low level, the PMOS transistor P7 is turned on and the latch circuit FF1 is reset. In this way, the node 10a (read node) and the node 20a (reference read node) are initialized to a low level.

Next, at timing T2, since the control signal WAB is set to a low level and the NMOS transistor N3 is set in a non-conductive state, the node 1a and the node 2a are electrically separated from each other and the node 11a and the node 12a are electrically separated from each other. As a result, the node 1a and the node 11a are set in a floating state. At timing T2, the node 1a and the node 11a are maintained at the voltage V2 (=VREADREF+VTN) which corresponds to a steady state in this charging operation. Immediately after timing T2, the control signal VWAVC1 is decreased by an amplitude voltage ΔVC1. As a result, because of coupling of the second capacitive element C2, the voltage of the node 1a and the node 11a is decreased from the voltage V2 by ΔVC2. The amplitude voltage ΔVC2 is a voltage determined by the parasitic capacitance of the node 1a, the capacitance value of the second capacitive element C2, and the amplitude ΔVC1 of the control signal VWAVC1.

By setting the control signal ENB to a high level at timing T2, the regulator circuit 41 in the feedback circuit voltage generator 112 is inactivated and the feedback circuit power voltage VFB is decreased from the voltage V1 to VSS. In the second exemplary embodiment, the feedback circuit voltage generator 112 is maintained active and VFB is maintained at VREADREF in the wait period (T2 to T3). However, the third exemplary embodiment differs from the second exemplary embodiment in that VFB is decreased to VSS. Since the voltage of the feedback circuit power supply VFB is decreased to VSS, the node 2a and the node 12a are decreased from the voltage V2 to VSS by the current through the NMOS transistor N2. In addition, in the period from timing T2 to T3, the control signal PRB is set to a high level to stop the current supply via the current drive circuit 35. Immediately after timing T2, the current drive node 4 and the reference current drive node 44 are maintained at voltages close to VDD by the parasitic capacitance of the nodes.

The period from timing T2 to T3 is a wait period. In this period, since charges accumulated by large parasitic capacitance of the reference data line 43 (larger than parasitic capacitance of the reference current drive node 44) are decreased by the current flowing through the reference resistor Rref2, the voltage of the reference data line 43 is gradually decreased (see the reference data line 43 represented by a dotted line in the period from T2 to T3 in FIG. 12). Likewise, charges accumulated by large parasitic capacitance of the data line 3 (larger than parasitic capacitance of the current drive node 4) are also gradually decreased by the current that flows on the basis of the resistance state of a corresponding resistive memory element 2 (see the data line 3 represented by a solid line and a dashed line in the period from T2 to T3 in FIG. 12).

In the period from timing T2 to T3, the gate-source voltage VGS of the NMOS transistor N1 is small and operates within a range of sub-threshold leak characteristics. FIG. 13 illustrates sub-threshold characteristics of the NMOS transistor N1. In FIG. 13, the horizontal axis represents the gate-source voltage VGS and the vertical axis represents a sub-threshold leakage current on a logarithmic scale. The current value changes by one digit between two adjacent graduations on the vertical axis. Until immediately before timing T2, the NMOS transistor N1 in the reference data line control circuit 76 operates at an operation point A in FIG. 13. At the operation point A, since the source and the gate of the NMOS transistor N1 are at the voltage VREADREF and the voltage VREADREF+VTN (=V2), respectively, the gate-source voltage VGS is at VTN. Thus, the current iR illustrated in FIG. 13 flows.

Immediately after timing T2, since the gate of the NMOS transistor N1 is decreased by the amplitude voltage $\Delta$VC2, the gate-source voltage VGS reaches VGSB=VTN–$\Delta$VC2. Thus, the NMOS transistor N1 operates at an operation point B in FIG. 13. Namely, the current value is decreased to a current value iB, which is significantly smaller than the current value iR. In FIG. 13, the current value iB is smaller than the current value iR by two digits. From immediately after timing T2, when the NMOS transistor N1 starts operating at the operation point B, the voltage held by the parasitic capacitance of the reference current drive node 44 is decreased by the current value iB.

Thereafter, the voltage of the reference data line 43 is gradually decreased. However, since the gate-source voltage VGS of the NMOS transistor N1 is increased to be larger than VGSB by the decreased voltage, the current that the NMOS transistor N1 flows from the reference current drive node 44 is gradually increased to be larger than the current value iB. As a result, the voltage decrease rate of the reference current drive node 44 is gradually increased. This increase of the current value depends on the voltage decrease rate of the reference data line 43, namely, on the resistance value of the reference resistor Rref2.

Likewise, the voltage of a current drive node 4 in each data line control circuit 36 is also decreased depending on the resistance value of a resistive memory element 2 coupled to a corresponding data line 3. If the resistive memory element 2 has a high resistance value, the voltage of the current drive node 4 is decreased gradually (see a solid line representing the current drive node 4 in the period from timing T2 to T3 in FIG. 12). If the resistive memory element 2 has a low resistance value, the voltage of the current drive node 4 is decreased rapidly (see a dashed line representing the current drive node 4 in the period from timing T2 to 13 in FIG. 12).

In this way, according to the third exemplary embodiment, if the resistive memory element 2 is in a high resistance state, the voltage decrease rate of the current drive node 4 is slow. In contrast, if the resistive memory element 2 is in a low resistance state, the voltage decrease rate of the current drive node 4 is fast. In the next determination period, whether the voltage decrease rate is faster or slower than that of the reference resistor Rref2 is determined.

Next, the period from timing T3 to T4 is a determination period. When the voltage of the reference current drive node 44 is decreased to V3 (=VDD–|VTP|), the PMOS transistor P5 in the reference read determination circuit 72 in the reference data line control circuit 76 is turned on and the node 20$a$ (reference read node) is changed from a low level to a high level (at timing T3). In response to this change, the one-shot circuit 48 outputs a low-level control signal RJB in one shot until timing T4. In this one-shot period (determination period), a read determination circuit 12 in each data line control circuit 36 determines whether the voltage of a corresponding current drive node 4 is higher or lower than the voltage V3 (namely, whether the voltage decrease rate is higher or slower than that of the reference resistor Rref2) and stores the determination result in the latch circuit FF1 in a corresponding data input/output circuit 11.

Next, at timing T4, in response to the change of the control signal RJB from a low level to a high level, the data control circuit 37 sets the control signal WAB to a high level and the control signal PRB to a low level. In addition, the amplitude decrease $\Delta$VC1 of the control signal VWAVC1 is set back to 0. As a result, the nodes 1$a$ and 11$a$ are reset to VSS and the reference current drive node 44 and the current drive node 4 are reset to VDD.

At the next timing T5, the reference data line 43 and each data line 3 are reset to VSS. In this way, the read operation is completed.

While at timing T2 the voltage of the nodes 1$a$ and 11$a$ is decreased by the amplitude voltage $\Delta$VC2, this is to set the time period from timing T2 to timing T3 to an appropriate time period in view of circuit operation. Without this decrease by the amplitude voltage $\Delta$VC2, the reference current drive node 44 would be decreased quickly and excessively, and the time period from timing T2 to timing T3 would be shortened to be approximately the same as the one-shot width of the control signal RJB. Since the voltage of the reference current drive node 44 significantly changes in the period from timing T3 to timing T4, the resistance value cannot accurately be determined.

In contrast, if the amplitude voltage $\Delta$VC2 were excessively increased, the voltage decrease rate of the reference current drive node 44 would be very slow. As a result, the read operation would be slowed. The time period from timing T2 to T3 can be adjusted by the capacitance C2 and the amplitude voltage $\Delta$VC1 of the control signal VWAVC1. Particularly, if determination resistance is changed in a semiconductor device operation test, the reference resistor Rref2 may be changed by fuse trimming or the like. In this case, by simultaneously adjusting the amplitude voltage $\Delta$VC1 to an appropriate value in addition to the reference resistor Rref2, the time period for the read operation can be maintained to be a certain time period as desired.

Through the read operation as described above, whether the resistance value of the resistive memory element 2 is higher or lower than that of the reference resistor Rref2 is read.

As described above, the third exemplary embodiment provides the same advantageous effects as those provided by the first and second exemplary embodiments. Namely, in the same way as the read data line drive circuit 243 according to the related techniques illustrated in FIGS. 22A and 22B, each read data line drive circuit 33 can perform feedback control and can charge a corresponding data line 3 quickly and accurately up to the voltage of the reference signal VREADREF. In addition, since each feedback circuit 34 according to the third exemplary embodiment can be configured as a circuit with a simple configuration, a plurality of data line control circuits 36 can be arranged at shorter intervals. As a result, the number of memory cells MC to be read simultaneously in a single cell read operation can be increased, and high-speed data output can be realized.

In addition, according to the third exemplary embodiment, not only each data line 3 can be charged quickly and accurately, but also the resistance state of each resistive memory element 2 can be read with a circuit having a simple configuration.

In addition, according to the third exemplary embodiment, the feedback circuit voltage generator 112 is maintained inactive in the wait period and the determination period. Thus, the semiconductor device according to the third exemplary embodiment can operate with lower power consumption, compared with that according to the second exemplary embodiment in which the feedback circuit voltage generator 112 are maintained active in these periods. In addition, according to the third exemplary embodiment, since each current drive circuit 35 does not supply the current iR to a corresponding current drive node 4, the semiconductor device according to the third exemplary embodiment can operate with low power consumption, compared with that according to the second exemplary embodiment in which each current drive circuit 35 supplies the current iR to a corresponding current drive node 4. In addition, according to the third exemplary embodiment, by causing each NMOS transistor N1 to operate in a region where the sub-threshold current is small (for example, at the operation point B in FIG. 13), the semiconductor device can operate with even lower power consumption.

According to the third exemplary embodiment, as illustrated in FIG. 11, each feedback circuit 34 includes the NMOS transistor (third switch element) N3 and the second capacitive element C2, in addition to the elements in the feedback circuit (24 in FIG. 6) according to the second exemplary embodiment. However, the feedback circuit 34 is not limited to such configuration. An arbitrary feedback circuit is applicable as long as the feedback circuit has a function of increasing the potential of the node 2a (second node) when the potential of the data line 3 is lower than VREADREF and of decreasing the potential of the node 2a (second node) when the potential of the data line 3 is higher than VREADREF. For example, the NMOS transistor N3 and the second capacitive element C2 may be arranged between the output terminal of the differential amplifier AMP3V in the feedback circuit 244 and the gate of the NMOS transistor N1 according to the related techniques illustrated in FIGS. 22A and 22B. In such case, while the feedback circuit does not have a simple configuration, not only the charging of the data line 3 but also the reading of the resistance state of the resistive memory element 2 can be achieved without adding a circuit. In addition, lower power consumption can be achieved.

Fourth Exemplary Embodiment

Configuration According to Fourth Exemplary Embodiment

Next, a configuration according to a fourth exemplary embodiment will be described with reference to FIGS. 14 and 15. A semiconductor device according to the fourth exemplary embodiment includes a data line control circuit 46, a reference data line control circuit 86, and a data control circuit 47 in FIG. 14, in place of the data line control circuit 36, the reference data line control circuit 76, and the data control circuit 37 in the semiconductor device according to the third exemplary embodiment, respectively. In FIG. 14, the data line control circuit 46 differs from the data line control circuit 36 in that a feedback circuit 64 has the same configuration as that of the feedback circuit 24 according to the second exemplary embodiment. In addition, as in the second exemplary embodiment, the gate of the PMOS transistor P7 in the data input/output circuit 11 is coupled to the control signal PRB.

Likewise, a feedback circuit 84 in the reference data line control circuit 86 in FIG. 14 has the same configuration as that of the feedback circuit 24 according to the second exemplary embodiment. In addition, the gate of the PMOS transistor P7 in the data input/output circuit 71 is coupled to the control signal PRB. In the fourth exemplary embodiment, constituent elements having the same functions as those in the second or third exemplary embodiment are denoted by the like reference characters, and redundant description will be omitted.

FIG. 15 is a circuit diagram illustrating a part of the data control circuit 47. In FIG. 15, the constant current mirror source circuit 51 and the VINREF generator 52 are the same as those according to the third exemplary embodiment. In contrast, compared with the feedback circuit voltage generator 112 according to the third exemplary embodiment, a feedback circuit voltage generator 114 has an extended function. More specifically, the feedback circuit voltage generator 114 additionally inputs a judge reference signal VJUDGEREF and selects and outputs one of the voltage V1 (=VREADREF+|VTP|) and a voltage V4 (=JUDGEREF+|VTP|).

As illustrated in FIG. 15, a PMOS transistor P14V and a PMOS transistor P13V generate the voltage V4 to a node 6a. In addition, the feedback circuit voltage generator 114 includes PMOS transistors P15V and P16V and an inverter circuit INV2V and switches the node 3a and the node 6a on the basis of the logic of the control signal PRB to output a voltage to a node 7a. The regulator circuit 41 inputs the voltage of the node 7a.

As is the case with the PMOS transistor P1V, it is desirable that the PMOS transistor P13V and the PMOS transistor P1 in FIG. 14 be formed in the same process. By using the same process, the accuracy in matching the channel length and the channel width of the two PMOS transistors (P1, P13V) can be improved, and the two PMOS transistors can have the same current drive capability. Thus, the voltage of the node 6a can accurately be matched to a voltage, which is a sum of VJUDGEREF and the absolute value |VTP| of the threshold voltage of the PMOS transistor P1. In addition, as will be described below, the voltage of the judge reference signal VJUDGEREF is the determination level for each data line 3. Thus, it is desirable that this voltage be set at a level somewhat lower than the voltage of the read reference signal VREADREF (see $\Delta VC3$ in FIG. 16).

Operation According to Fourth Exemplary Embodiment

Next, an operation according to the fourth exemplary embodiment will be described with reference to FIG. 16. FIG. 16 is a waveform diagram illustrating a read operation of the semiconductor device according to the fourth exemplary embodiment. In the upper portion in FIG. 16, the voltages of the control signals ENB and PRB are illustrated. In the middle portion in FIG. 16, the voltages of the data line 3, the reference data line 43, the current drive node 4, the reference current drive node 44, the node 11a, and the feedback circuit power supply are illustrated. In addition, in the lower portion in FIG. 16, the voltage of the node 20a (reference read node) and the node 10a (read node) are illustrated. Among these waveforms, those corresponding to a memory cell in a high resistance state are represented by solid lines, those corresponding to a memory cell in a low resistance state are represented by dashed lines, and those relating to the reference control circuit are represented by dotted lines.

In FIG. 16, as in the second and third exemplary embodiments, in the period from timing T1 to T5, a word line WL and a multiplexer address BA corresponding to a data-read-target memory cell MC remain active.

The period from timing T1 to T2 is a charging period of the data line 3. In this period, since both the control signals ENB and PRB are set to a low level, the node 7a (FIG. 15) is set to the voltage V1 and the feedback circuit power supply VFB outputs the voltage V1. As a result, as in the second and third exemplary embodiments, the data line 3 and the reference data line 43 are charged with the voltage VREADREF. In addition, by changing the control signal PRB to a low level at timing T1, the PMOS transistor P7 is turned on and the latch circuit FF1 is reset. As a result, the node 10a (read node) and the node 20a (reference read node) are initialized to a low level. In addition, in the period from timing T1 to T2, since the PMOS transistors P4 in the current drive circuits 35 and 75 are turned on, the current drive node 4 and the reference current drive node 44 are driven to VDD.

Next, the period from the timing T2 to T3 is a wait period. By changing the control signal PRB to a high level at timing T2, the voltage of the node 7a (FIG. 15) is changed to the voltage V4 and the feedback circuit power supply VFB outputs the voltage V4. As a result, the determination level of the data line 3 in the feedback circuit 64 and the determination level of the reference data line 43 in the feedback circuit 84 are set to a voltage which is lower than the voltage V4 by the absolute value |VTP| of the threshold voltage of the PMOS transistor P1, namely, to VJUDGEREF. Thus, since the voltage of the data line 3 and the reference data line 43 is VREADREF, which is a voltage higher than VJUDGEREF immediately after timing T2, the PMOS transistor P1 is turned off and the voltage of the nodes 1a and 11a is decreased close to VSS. Accordingly, the NMOS transistor N1 is turned off. In addition, since the control signal PRB is set to a high level in the period from timing T2 to T3, the current drive circuits 35 and 75 stop supplying the voltage VDD. As a result, while the current drive node 4 and the reference current drive node 44 are set in a floating state immediately after timing T2, these nodes 4 and 44 hold a voltage close to VDD because of the parasitic capacitance thereof.

After timing T2, since charges accumulated by the large parasitic capacitance of the reference data line 43 are decreased by the current flowing through the reference resistor Rref2, the voltage of the reference data line 43 is gradually decreased (reference data line 43: dotted line in the period from timing T2 to T3 in FIG. 16). Next, when the reference data line 43 is decreased to the voltage VJUDGEREF at timing 13, the PMOS transistor P1 is turned on to increase the voltage of the node 11a to a high voltage and turn on the NMOS transistor N1. When the NMOS transistor N1 is turned on, the voltage of the reference current drive node 44 is decreased from VDD to the voltage of the reference data line 43 (reference current drive node 44: dotted line at timing T3 in FIG. 16).

Likewise, the voltage of the data line 3 is also decreased gradually on the basis of the current that flows depending on the resistance value of a corresponding resistive memory element 2 (data line 3 in the period from timing T2 to T3 in FIG. 16). If the resistive memory element 2 is in a low resistance state, the voltage of the corresponding data line 3 is decreased to the voltage VJUDGEREF before timing T3. Thus, the current drive node 4 in the data line control circuit 46 is decreased to the voltage of the data line 3 before timing T3 (current drive node 4: dashed line in the period from timing T2 to T3 in FIG. 16).

In contrast, if the resistive memory element 2 has a high resistance state, the voltage of the corresponding data line 3 is not decreased to the voltage VJUDGEREF at timing T3. Thus, the current drive node 4 in the data line control circuit 46 holds a voltage close to VDD (current drive node: solid line in the period from timing T2 to T3 in FIG. 16).

As described above, according to the fourth exemplary embodiment, if the resistive memory element 2 has a resistance state lower than that of the reference resistor Rref2, the potential decrease rate of the current drive node 4 is faster than that of the reference drive node 44. In contrast, if the resistive memory element 2 has a resistance state higher than that of the reference resistor Rref2, the potential of the reference drive node 4 has not been decreased yet at timing when the potential of the reference drive node 44 has already been decreased.

The period from timing T3 to T4 is a determination period. At timing T3, if the reference current drive node 44 is decreased to a voltage lower than the voltage V3, the PMOS transistor P5 in the reference read determination circuit 72 is turned on and the node 20a (reference read node) is changed from a low level to a high level. In response to this change, the one-shot circuit 48 outputs a low-level control signal RJB in one shot until timing T4. In this one-shot period (determination period), a read determination circuit 12 in each data line control circuit 46 determines whether a corresponding current drive node 4 has a voltage higher or lower than the voltage V3 and stores the determination result in a corresponding latch circuit FF1 in each data input/output circuit 11.

At timing T4, in response to the change of the control signal RJB from a high level to a low level, the data control circuit 47 sets the control signal ENB to a high level. As a result, the feedback power supply voltage VFB, the node 1a, and the node 11a are decreased to VSS.

Next, at timing T5, the reference data line 43 and each data line 3 are reset to VSS. In this way, the read operation is completed.

With the voltage $\Delta VC3$ (=VREADREF−VJUDGEREF), the time period from timing T2 to T3 can be set to an appropriate time period in view of circuit operation. The reason for, the advantageous effects provided by, and the adjustment method of setting such appropriate time period are the same as those described in relation to the adjustment of the amplitude voltage $\Delta VC1$ of the control signal VWAVC1 according to the third exemplary embodiment.

Through the above read operation, whether the resistance value of the resistive memory element 2 is higher or lower than that of the reference resistor Rref2 is determined.

As described above, the fourth exemplary embodiment provides the same advantageous effects as those provided by the first and second exemplary embodiments. Namely, in the same way as the read data line drive circuit 243 according to the related techniques illustrated in FIGS. 22A and 22B, each read data line drive circuit 143 can perform feedback control and can charge a corresponding data line 3 quickly and accurately up to the voltage of the reference signal VREADREF. In addition, since each feedback circuit 64 according to the fourth exemplary embodiment can be configured as a circuit with a simple configuration, a plurality of data line control circuits 46 can be arranged at shorter intervals. As a result, the number of memory cells MC to be read simultaneously in a single cell read operation can be increased, and high-speed data output can be realized.

Each feedback circuit 64 according to the fourth exemplary embodiment can be configured without the third switch element N3 and the second capacitive element C2 in the feedback circuit 34 according to the third exemplary embodiment (namely, the feedback circuit 64 can have the same configuration as that of the feedback circuit 24 according to the second exemplary embodiment). In this way, each data line control circuit 46 according to the fourth exemplary embodiment can have a simpler configuration than that of each data line control circuit 36 according to the third exemplary embodiment.

In addition, according to the fourth exemplary embodiment, as is the case with the third exemplary embodiment, since each current drive circuit 35 does not supply the current iR to a corresponding current drive node 4, the semiconductor device according to the fourth exemplary embodiment can operate with lower power consumption than the semiconductor device according to the second exemplary embodiment in which each current drive circuit 35 supplies the current iR to a corresponding current drive node 4.

In addition, according to the fourth exemplary embodiment, not only each data line 3 can be charged quickly and accurately, but also the resistance state of each resistive memory element 2 can be read with a circuit having a simple configuration.

Fifth Exemplary Embodiment

Configuration According to Fifth Exemplary Embodiment

Next, a configuration according to a fifth exemplary embodiment will be described with reference to FIGS. 17 to 19. The configuration according to the fifth exemplary embodiment includes a simple write determination function, in addition to the configuration in the fourth exemplary embodiment. The fifth exemplary embodiment will be described with a focus on the simple write determination function. Constituent elements having the same functions as those in the fourth exemplary embodiment are denoted by the like reference characters, and redundant description will be omitted.

First, the background of the fifth exemplary embodiment will be described. Write control of a resistive memory element (namely, control of change of the resistance value of a resistive memory element to a higher/lower value) is performed by applying a voltage across the resistive memory element. It is known that, in the case of a resistive memory element such as a ReRAM, resistance values obtained after a write voltage is applied have a statistical distribution and that the resistance value stochastically changes within such distribution each time a write voltage is applied. Thus, after a write voltage is once applied, a "write and read" operation is performed. In this "write and read" operation, whether the resistance value has been changed within a desired range by a read operation on the basis of the accurate read voltage VREADREF illustrated in FIG. 16 or the like is determined (namely, whether a write operation has been completed successfully is determined). In addition, if a memory cell is not successfully written, the "write and read" operation needs to be performed again only on such memory cell, and until all the memory cells are successfully written, the "write and read" operation is repeated. Namely, the accuracy of the write operation needs to be verified. However, each time a write voltage is applied, a long data line charging period is required in a read operation. Thus, if the write success rate is low, more "write and read" operations need to be performed. As a result, much time is required until all the memory cells are successfully written, counted as a problem.

In the fifth exemplary embodiment, to solve this problem, the following sequence is performed when a plurality of memory cells are simultaneously written. Namely, after each write circuit 58 applies a large voltage to a corresponding data line 3 for writing, the write circuit 58 is stopped, the parasitic capacitance of the data line 3 is discharged by the resistance of a corresponding memory cell MC, and the voltage of the data line 3 is determined after a predetermined time. In this way, a simple determination for determining "probably successfully written" or "probably unsuccessfully written" is performed. If a memory cell is determined to have probably unsuccessfully been written, the cycle, in which a large voltage is applied to a corresponding data line 3 by a corresponding write circuit 58 again only on such memory cell, the data line 3 is discharged, and the voltage of the data line 3 is simply determined after a predetermined time, is repeated a plurality of times. Subsequently, whether the resistance value has been changed within a desired range by a read operation on the basis of the accurate read voltage VREADREF illustrated in FIG. 16 or the like is accurately determined (namely, whether a write operation has been completed successfully is accurately determined). The above sequence according to the fifth exemplary embodiment will be referred to as "a simple write determination and read" operation. Since a write voltage application and a simple determination are repeated a plurality of times in a single "simple write determination and read" operation, the write success rate can be increased. As a result, the overall write time can be shortened.

Generally, the resistance value of a resistive memory element such as a ReRAM has bias dependence (not ohmic resistance). Thus, reading needs to be performed with an accurate read voltage (VREADREF). In addition, when a voltage (for example, a write voltage) larger than the read voltage (VREADREF) is applied to the resistive memory element, the resistance value of the resistive memory element may change. In addition, there are resistive memory elements whose resistance value may change in a wait period in which discharging is performed. For these reasons, in the above simple determination, the writing can only be determined to have probably been succeeded or failed. Thus, according to the fifth exemplary embodiment, as described above, at the end of a single "simple write determination and read" operation, an accurate read operation is performed with the read voltage (VREADREF).

FIG. 17 is a circuit diagram of a data line control circuit 56 and a reference data line control circuit 96 in a semiconductor device according to the fifth exemplary embodiment. When FIG. 17 is compared with FIG. 14 (the fourth exemplary embodiment), it becomes clear that the write circuit 58, a reference write circuit 98, and a feedback circuit voltage generator 116 in FIG. 17 are changed from those in FIG. 14 and that a one-shot circuit 49 is newly added in FIG. 17. Other than these constituent elements, those having substantially the same functions as those in the fourth exemplary embodiment are denoted by the like reference characters, and redundant description will be omitted.

The write circuit 58 in the data line control circuit 56 will be described with reference to FIG. 18. In FIG. 18, the write circuit 58 includes a data line drive circuit 120, a latch circuit FF2, and NMOS transistors (second transistors N1W, N2W, N3W). The data line drive circuit 120 includes two PMOS transistors P1W and P2W coupled in series with each other. The PMOS transistor P1W has a gate supplied with a write timing signal and the PMOS transistor P2W has a gate coupled to an output from the latch circuit FF2. With this configuration, when both the write timing signal and the output from the latch circuit FF2 are at a low level, the two PMOS transistors P1W and P2W are set in a conductive state. As a result, the voltage VDD is applied to each data line 3.

The two NMOS transistors N2W and N3W are coupled in series with each other between an input node of the latch circuit FF2 and the ground VSS. The NMOS transistor N2W has a gate supplied with an output signal WJT from the one-shot circuit 49. The NMOS transistor N3W has a gate coupled to the node 1a. With this configuration, when the node 1a is a high level, if the one-shot circuit 49 outputs a one-shot signal and the signal WJT is set to a high level, the two NMOS transistors N2W and N3W are set in a conductive state, a write flag signal WRITE_FLAG is inactivated (low level), and the data line drive circuit 120 is inactivated.

In addition, the NMOS transistor N1W has one of a source and a drain coupled to the input node of the latch circuit FF2 and the other one of the source and the drain supplied to write data 59. In addition, the NMOS transistor N1W has a gate supplied with a data transfer signal. With this configuration, when the latch circuit FF2 is set on the basis of the write data 59, the data transfer signal is set to a high level and the logic level of the write data is inputted to the input node of the latch circuit FF2.

Next, the reference write circuit 98 in the reference data line control circuit 96 will be described with reference to FIG. 19. When FIG. 19 is compared with FIG. 18, it becomes clear that a PMOS transistor P3W is arranged in FIG. 19 in place of the NMOS transistor N1W in FIG. 18. The PMOS transistor P3W has a gate supplied with the write timing signal. In addition, the data line 3, WRITE_FLAG, the write data 59, and WJT in the write circuit 58 in FIG. 18 are replaced by the reference data line 43, REF_WRITE_FLAG, VDD), and VDD in the reference write circuit 98 in FIG. 19, respectively. In addition, REF_WRITE_FLAG (an input signal of the latch circuit FF2) in FIG. 19 is coupled to an input node of the one-shot circuit 49 and is used for generating a one-shot signal.

With this configuration, each time the write timing signal is set to a low level (activated) in the reference write circuit 98, the two PMOS transistors P1 W and P2W are set in a conductive state and the voltage VDD is applied to the reference data line 43. In addition, when the write timing signal is at a high level, if the node 11*a* is changed to a high level. REF_WRITE_FLAG is changed to a low level.

The write circuit 58 in FIG. 18 uses the voltage of the node 1*a* to perform a simple determination. In a read operation according to the second to fourth exemplary embodiments, change of the voltage of the current drive node 4 is detected. However, since the current drive circuit 35 is not operated in a write operation, the current drive node 4 cannot be used for a simple determination. Thus, change of the voltage of the node 1*a* is used for a simple determination. When the voltage of the data line 3> a simple write determination reference VWJREF, the PMOS transistor P1 is turned off, and the node 1*a* is set to a low level (the simple write determination reference VWJREF is a determination voltage when the data line 3 is discharged. This voltage will be described in detail with reference to FIG. 20 below). In contrast, if the voltage of the data line 3< the simple write determination reference VWJREF, the PMOS transistor P1 is turned on and the node 1*a* is set to a high level. Thus, whether the voltage of the data line 3 discharged in a wait period is higher or lower than the simple write determination reference VWJREF can be determined by the voltage of the node 1*a*.

Figure 19:
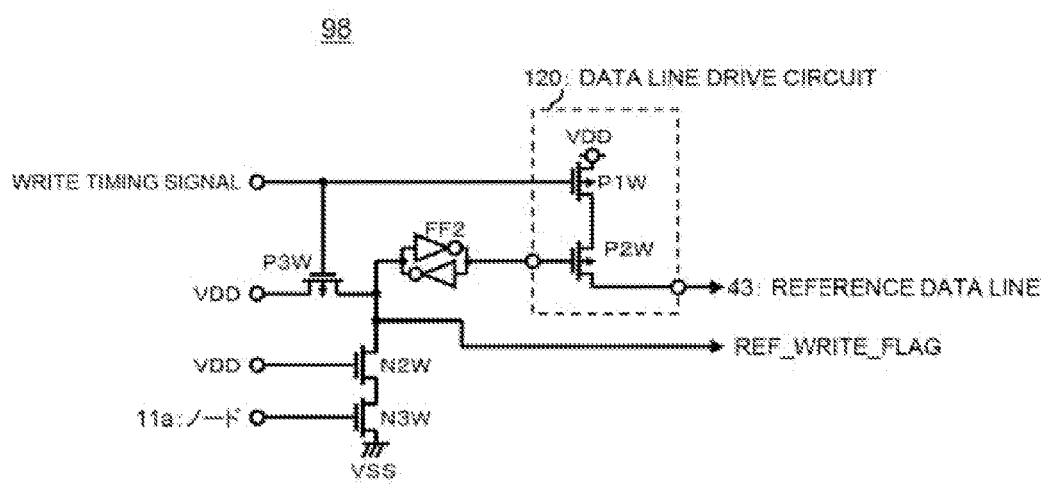
FIG. 19 is a circuit diagram illustrating a reference write circuit in the semiconductor device according to the fifth exemplary embodiment.

The reference write circuit 98 in FIG. 19 also uses change of the voltage of the node 11*a* when a simple determination is performed. If the voltage of the reference data line 43> the simple write determination reference VWJREF, the PMOS transistor P1 is turned off and the node 11*a* is set to a low level. In contrast, if the voltage of the reference data line 43< the simple write determination reference VWJREF, the PMOS transistor P1 is turned on and the node 11*a* is set to a high level. Thus, whether the voltage of the reference data line 43 discharged in a wait period is higher or lower than the simple write determination reference VWJREF can be determined by the voltage of the node 11*a*.

Next, the one-shot circuit 49 in FIG. 17 will be described. The one-shot circuit 49 has a function of outputting a one-shot signal WJT when the reference write circuit 98 changes the signal REF_WRITE_FLAG from a high level to a low level. The one-shot signal is a pulse that is set to a high level in a simple determination period (see FIG. 20). As described above, since the signal REF_WRITE_FLAG changes to a low level when the node 11*a* changes to a high level, the one-shot signal is generated when the node 11*a* changes to a high level. Since the interconnect of the signal WJT is coupled to the gate of the NMOS transistor N2W in the write circuit 58, the WRITE_FLAG in the write circuit 58 is controlled by the one-shot signal.

Next, the feedback circuit voltage generator 116 in FIG. 17 will be described. In the fourth exemplary embodiment, the feedback circuit voltage generator 114 inputs two voltages (VREADREF and VJUDGEREF) and is configured to be capable of switching corresponding output voltages (V1 and V4) (see FIG. 15). The feedback circuit voltage generator 116 according to the fifth exemplary embodiment further includes the simple write determination reference voltage VWJREF as an input to generate and output a corresponding output voltage VWJ1 (=VWJREF+|VTP|). While a detailed circuit diagram of the feedback circuit voltage generator 116 is not illustrated, it is only necessary to add a circuit for generating the voltage VWJ1 to the circuit for generating the voltages of the node 3*a* and the node 6*a* in FIG. 15.

Operation According to Fifth Exemplary Embodiment

Next, an operation according to the fifth exemplary embodiment will be described with reference to FIG. 20. FIG. 20 illustrates a sequence of the above "simple write determination and read" operation performed when a write operation is performed with write data supplied from the outside to a plurality of memory cells via a plurality of data line control circuits 56, respectively. The write operation assumes a SET write operation (namely, a write operation in which a low resistance state is set). When the write data represents a logical value "1," the write operation is performed.

In the upper portion in FIG. 20, the control signals ENB and PRB, the read/write buses RWBS, and the data transfer signal and the write timing signal supplied to the write circuit 58 are illustrated. In the middle portion in FIG. 20, the voltages of the feedback circuit power supply VFB, the data line 3, the reference data line 43, the node 1*a*, and the node 11*a* are illustrated. In the lower portion in FIG. 20, the signal WJT, which is an output from the one-shot circuit 49, and the write flag signal WRITE_FLAG are illustrated. Among these waveforms, those corresponding to a memory cell in a high resistance state are represented by solid lines, those corresponding to a memory cell in a low resistance state are represented by dashed lines, and those relating to the reference control circuit are represented by dotted lines.

In FIG. 20, first, a write command is inputted to the terminal COM in FIG. 10 at timing TW1. Next, the period from timing TW2 to TW3 is a data input period in which write data is inputted via DQ terminals in FIG. 10 and the write data is sequentially captured in the latch circuits FF1 in the data line control circuits 56 via the read/write buses RWBS, respectively.

Next, the sequence of the "simple write determination and read" operation starts at timing TW3. First, at timing TW3, the data transfer signal is activated in one shot, and the write data held in the latch circuits FF1 is inputted to the write circuits 58 and is captured in the latch circuits FF2 in the write circuits 58, respectively. Here, the write flag signals WRITE_FLAG of the write circuits 58 corresponding to memory cells MC on which a SET write operation is performed are set to a high level. In addition, at timing TW3, the control signal ENB is set to a low level, the feedback circuit voltage generator 116 is activated, and the feedback circuit voltage VFB is set to the voltage VWJ1.

Next, the period from timing TW41 to TW71 is a simple write determination period in cycle 1 in which a write voltage application and simple determination are performed. First, at timing TW41, the write timing signal is set to an active low level. In each data line control circuit 56 where the write flag signal WRITE_FLAG is at a high level, the write voltage VDD is applied to the data line 3 in the period from timing TW41 to TW51 (write drive period). Since the voltage (VDD) of the data line 3> the simple write reference VWJREF, the node 1*a* is changed to a low level.

Next, the period from timing TW51 to TW61 is a wait period. At timing TW51, the write timing signal is set to an inactive high level, and each write circuit 58 stops applying the voltage VDD. In this period, the data lines 3 release charges accumulated in the parasitic capacitance thereof via the respective memory cells MC. At this timing, if a resistive memory element 2 has a low resistance value due to a SET write operation, the voltage of the corresponding data line 3 is quickly decreased. In contrast, if a resistive memory element 2 has a high resistance value, the voltage of the corresponding data line 3 is gradually decreased.

In the wait period from timing TW51 to TW61, also in the reference data line control circuit 96, the reference data line 43 releases charges accumulated in the parasitic capacitance thereof via the reference resistor Rref2. When the reference data line 43 is decreased to the voltage VWJREF at timing TW61, the node 11*a* is changed to a high level. In addition, in response to the change of the node 11*a*, the reference write circuit 98 in FIG. 19 changes the reference write flag signal REF_WRITE_FLAG from a high level to a low level. In addition, the one-shot circuit 49 receives this change, and outputs a one-shot signal as the control signal WJT in the period from timing TW61 to TW71 (simple determination period).

In the period from timing TW61 to TW71 (simple determination period), if a node 1*a* is changed to a high level, namely, if the voltage of a data line 3 is significantly changed to be equal to or lower than the voltage VWJREF, the corresponding write flag signal WRITE_FLAG is changed to a low level. This means that the resistive memory element 2 has a resistance value lower than that of the reference resistor Rref2 and that the SET write operation has probably been succeeded. In contrast, if in this simple determination period a node 1*a* is changed to a low level, namely, if the voltage of a data line 3 is not significantly changed and is equal to or higher than the voltage VWJREF, the corresponding write flag signal WRITE_FLAG remains at a high level. This means that corresponding the resistive memory element 2 has a resistance value higher than that of the reference resistor Rref2 and that the SET write operation has probably failed.

As illustrated in FIG. 20, in the simple determination period, when the resistive memory element 2 is in a low resistance state, the data line 3 (dashed line) has been decreased to be lower than the voltage VWJREF and the corresponding write flag signal WRITE_FLAG (dashed line) has been changed to a low level. In contrast, when the resistive memory element 2 is in a high resistance state, the data line 3 (solid line) is above the voltage VWJREF and the write flag signal WRITE_FLAG (solid line) remains at a high level.

Next, the period from timing TW42 to TW72 is a simple write determination period in cycle 2 in which a write voltage application and a simple determination are performed. The write flag signal WRITE_FLAG of the write circuit 58 corresponding to a memory cell MC that has not probably successfully been written in cycle 1 remains at a high level. In cycle 2, if a write flag signal WRITE_FLAG remains at a high level, only the corresponding memory cell MC is written.

More specifically, in the period from timing TW42 to TW52 (write drive period), the write timing signal is set to an active low level, and the write voltage VDD is applied to the data line 3 corresponding to the write circuit 58 having a high-level write flag signal WRITE_FLAG. In contrast, since the write flag signals WRITE_FLAG of the other write circuits 58 corresponding to the memory cells that have probably successfully been written in cycle 1 are set to a low level, the write voltage is not applied to the corresponding data lines 3.

The reference write flag signal REF_WRITE_FLAG of the reference write circuit 98 is set to an active high level by the activation of the write timing signal from timing TW42 to TW52, and the write voltage VDD is applied to the reference data line 43.

Next, the period from timing TW52 to TW62 is a wait period in cycle 2 and the period from timing TW62 to TW72 is a simple determination period in cycle 2. As illustrated in FIG. 20, regarding the memory cell that has not probably successfully been written in cycle 1, the voltage (solid line) of the data line 3 is decreased to VWJREF or lower in the simple determination period in cycle 2. Namely, the memory cell has probably successfully been written. In addition, consequently, the corresponding write flag signal WRITE_FLAG is changed to a low level (solid line).

Next, the period from timing TW43 to TW53 is a period in cycle 3. In this period, the write voltage VDD is applied only to data lines 3 corresponding to memory cells MC that have not probably successfully been written in cycle 2. In cycle 3, the operation in the wait period and the operation in the simple determination period are not performed. This is to perform an accurate read operation subsequently.

Next, at timing TW8, by setting the control signal ENB to a high level, the feedback circuit voltage VFB is inactivated. Next, a read operation as illustrated in FIG. 16 (the fourth exemplary embodiment) is performed to check whether each resistance value falls within a desired range by an accurate read operation. A result indicating successful writing or unsuccessful writing is stored in a latch circuit FF1 in each data input/output circuit 11. The above operation from timing TW3 to TW9 is a single "simple write determination and read" operation. In this operation, since a write voltage application and a simple determination are repeated a plurality of times, the write success rate can be significantly increased, compared with a case in which the write voltage is applied only once.

Next, only for data line control circuits 56 that have not successfully been written in the first "simple write determination and read" operation, the corresponding write flag signals WRITE_FLAG are set to an active high level at a start timing of the second "simple write determination and read" operation and a write operation is performed. Until all the memory cells MC are successfully written, the "simple write determination and read" operation is repeated.

As described above, the fifth exemplary embodiment provides the following advantageous effects. According to the fifth exemplary embodiment, each feedback circuit 54 is used for a simple write determination. Namely, a simple write determination can be performed with a simple circuit configuration. As a result, a plurality of data line control circuits 56 having a simple write determination function can be arranged at shorter intervals. In addition, the write time (including verification) can be shortened.

In the sequence illustrated in FIG. 20, a single "simple write determination and read" operation includes three cycles. However, the present disclosure is not limited to such example. In addition, the wait period and the simple determination in the last cycle may be omitted as described above.

In addition, FIG. 20 illustrates a case in which a SET write operation (a write operation in which a low resistance state is set). However, alternatively, the same method according to the fifth exemplary embodiment is applicable to a RESET write operation (a write operation in which a high resistance state is set). In such case, when change of the voltage of a data line 3 in a wait period is small (set to a high resistance state), it can be determined that writing has probably been succeeded and when change of the voltage of a data line 3 in a wait period is large (remaining in a low resistance state), it can be determined that writing has not probably been succeeded.

Sixth Exemplary Embodiment

Next, a sixth exemplary embodiment will be described with reference to FIG. 21. FIG. 21 is a circuit diagram of a data line control circuit and a reference data line control circuit in a semiconductor device according to a sixth exemplary embodiment. When FIG. 21 is compared with FIG. 14 (the fourth exemplary embodiment). FIG. 21 further includes an ultra-high resistance determination circuit 160. The ultra-high resistance determination circuit 160 is added for determining an insulated state or an ultra-high resistance state of a resistive memory element 2. Other elements that are the same as those in FIG. 14 are denoted by the like reference characters, and redundant description thereof will be omitted.

First, the background of the addition of the ultra-high resistance determination circuit 160 will be described. After formed, since resistive memory elements such as ReRAMs using metal oxide are in an insulated state or in an ultra-high resistance state, these resistive memory elements do not perform a switching operation with a normal write voltage. Thus, processing referred to as forming processing in which a high voltage is applied to resistive memory elements is performed. In this way, the resistive memory elements are initialized to be capable of performing a switching operation between a high resistance state and a resistance state.

In a test for determining voltage conditions in forming processing, a read circuit is required to perform an ultra-high resistance measurement mode in which an ultra-high resistance state is determined. In order to perform a read operation in such ultra-high resistance measurement mode, for example, the resistance value of the reference resistor Rref2 in FIG. 14 according to the fourth exemplary embodiment (FIG. 14) can be switched to an ultra-high resistance. However, since the reference data line 43 is coupled to the dummy MUXs 57 and the like as illustrated in FIG. 10, a minute leakage current may be caused by a defect or the like. If such leakage current is larger than the current by the ultra-high resistance value of the reference resistor Rref2, since the control signal RJB generated in the reference data line control circuit 86 is affected by the leakage current, all the data line control circuits 46 receiving the control signal RJB do not properly operate, counted as a problem.

To solve this problem, the sixth exemplary embodiment includes the ultra-high resistance determination circuit 160 illustrated in FIG. 21, as a circuit configuration appropriate for the ultra-high resistance measurement mode. The ultra-high resistance determination circuit 160 includes a first capacitive element C1 and an NMOS transistor N6, and the first capacitive element C1 has one end coupled to the reference data line 43 via the NMOS transistor N6. In addition, the first capacitive element C1 has the other end coupled to the ground VSS. In addition, the NMOS transistor N6 has a gate supplied with a measurement mode signal MODE1.

When the measurement mode signal MODE1 is set to a low level, the NMOS transistor N6 is turned off, and the semiconductor device operates in the normal measurement mode as in the fourth exemplary embodiment. In contrast, when the measurement mode signal MODE1 is set to a high level, the NMOS transistor N6 is turned on, and the semiconductor device operates in the ultra-high resistance measurement mode. Namely, according to the sixth exemplary embodiment, by using the measurement mode signal MODE1, the semiconductor device is configured to be capable of switching modes between the normal measurement mode and the ultra-high resistance measurement mode.

In the ultra-high resistance measurement mode, the capacitance value C1 of the first capacitive element is added to the interconnect capacitance of the reference data line 43. While the reference resistor Rref2 is not set to an ultra-high resistance state, addition of the first capacitive element C1 realizes discharging characteristics equivalent to those obtained by setting the reference resistor Rref2 to an ultra-high resistance state.

For example, if the capacitance value C1 of the first capacitive element is set to a value 100 times larger than that of the reference data line 43, the determination resistance value is set to a value 100 times larger than the resistance value of the reference resistor Rref2. In this case, if a minute leakage current caused by a defect or the like is sufficiently smaller than the current value flowing through the reference resistor Rref2, the determination resistance error can be reduced, and the ultra-high resistance measurement mode can be performed properly.

As described above, the sixth exemplary embodiment provides the following advantageous effects. According to the sixth exemplary embodiment, in addition to the advantageous effects provided by the fourth exemplary embodiment, reading in an ultra-high resistance state can be performed by arranging an ultra-high resistance measurement mode. Namely, a read determination can be performed by switching a threshold for logic determination in a reading operation to a value higher than that used in a normal measurement mode.

Part or all of each of the above exemplary embodiments can be described as the following modes. However, the above exemplary embodiments are not limited to the following modes.

(Mode 1)

A semiconductor device including: a resistive memory element; a data line electrically coupled to the resistive memory element; a control line; a power supply line; and a control circuit including a first constant current element, a first transistor, and a second transistor, wherein, in the control circuit, the first transistor has a gate coupled to the data line, one of a source and a drain coupled to the first constant current element, and the other one of the source and the drain coupled to the power supply line, and wherein, in the control circuit, the second transistor has a gate coupled to one of the source and the drain of the first transistor, one of a source and a drain coupled to the data line, and the other one of the source and the drain coupled to the control line.

(Mode 2)

The semiconductor device according to mode 1 further including; a voltage generator supplying a voltage to the power supply line, wherein the voltage generator supplies a first voltage, which is a sum of a first setting voltage applied to the data line and an absolute value of a threshold voltage of the first transistor, to the power supply line.

(Mode 3)

The semiconductor device according to mode 1 or 2, wherein the first current element is a resistor.

(Mode 4)

The semiconductor device according to mode 1 or 2, wherein the first constant current element in the control circuit is configured by a third transistor, wherein a first constant current source and a fourth transistor that forms a current mirror circuit with the third transistor are arranged outside the control circuit, and wherein a current flowing through the third transistor is controlled by the current mirror circuit on the basis of a current flowing through the first constant current source.

(Mode 5)

The semiconductor device according to mode 4, wherein the voltage generator includes a fifth transistor having a gate and a drain supplied with the first setting voltage and having a source supplied with a current equivalent to that flowing through the first constant current source, and wherein the voltage generator uses a source voltage of the fifth transistor as a reference voltage and generates the first voltage controlled by the reference voltage.

(Mode 6)

The semiconductor device according to any one of modes 2 to 5, wherein the control circuit includes a first switch element between a first power supply and the control line, and wherein the semiconductor device performs a first control operation in which the first switch element is set in a conductive state and the first voltage is supplied from the voltage generator to the power supply line to charge the data line with the first setting voltage.

(Mode 7)

The semiconductor device according to mode 6 further including: a second constant current element supplying a constant current to the control line, wherein, after the first control operation, the semiconductor device performs a second control operation in which the first switch element is set in a non-conductive state and the potential of the control line is determined a predetermined time after the timing when the first switch element is set in a non-conductive state.

(Mode 8)

The semiconductor device according to mode 6, wherein the voltage generator is configured to supply the first voltage or a second voltage, which is a sum of a second setting voltage set lower than the first setting voltage and the absolute value of the threshold voltage of the first transistor, to the power supply line, and wherein, after the first control operation, the semiconductor device performs a third control operation in which the first switch element is set in a non-conductive state, the voltage generator changes the voltage supplied to the power supply line to the second voltage, and the potential of the control line is determined a predetermined time after the timing when the first switch element is set in a non-conductive state.

(Mode 9)

The semiconductor device according to mode 8 further including: a reference resistance element; a reference data line coupled to the reference resistance element; a reference control line; and a reference control circuit having substantially the same configuration as that of the control circuit and controlling the reference data line and the reference control line, instead of the data line and the control line, wherein, in the first control operation, the reference data line is charged with the first setting voltage in the same way as the data line, and wherein, in the third control operation, the predetermined time is set on the basis of change of the potential of the reference control line.

(Mode 10)

The semiconductor device according to mode 9, wherein, in the third control operation, timing when the potential of the reference control line is decreased in response to decrease of the potential of the reference data line to the second setting voltage is timing that corresponds to elapse of the predetermined time.

(Mode 11)

The semiconductor device according to any one of modes 2 to 10, wherein the control circuit further includes: a write circuit including a latch circuit storing write data and a data line drive circuit applying a write voltage to the data line on the basis of the write data stored in the latch circuit, wherein the write circuit is coupled to a first node where one of the source and the drain of the first transistor is coupled to the gate of the second transistor, and wherein the write circuit inverts the write data stored in the latch circuit on the basis of change of the potential of the first node to inactivate the data line drive circuit.

(Mode 12)

The semiconductor device according to mode 11, wherein the semiconductor device performs a fourth control operation in which, if the write data stored in the latch circuit is compatible with a predetermined write operation, the data line drive circuit applies the write voltage to the data line to write the data, and wherein, after the fourth control operation, the semiconductor device performs a fifth control operation in which the application of the write voltage is stopped and the potential of the control line is determined a predetermined time after the timing when the application of the write voltage is stopped.

(Mode 13)

The semiconductor device according to mode 12, wherein, in the fifth control operation, if change of the potential of the first node is not detected and if the write data stored in the latch circuit is not inverted, the fourth and fifth control operations are repeated.

(Mode 14)

The semiconductor device according to mode 12 or 13 further including: a reference resistance element; a reference data line coupled to the reference resistance element; a reference control line; and a reference control circuit having substantially the same configuration as that of the control circuit and controlling the reference data line and the reference control line, instead of the data line and the control line, wherein, in the fifth control operation, the predetermined time is set on the basis of change of the potential of a first reference node in the reference control circuit corresponding to the first node in the control circuit.

(Mode 15)

The semiconductor device according to mode 13 or 14, wherein, after the fifth control operation, verification is performed by a read operation including charging with the first setting voltage.

(Mode 16)

The semiconductor device according to mode 9 or 14 further including: a second switch element and a first capacitive element having one end coupled to the reference data line via the second switch element, wherein the semiconductor device is configured to be capable of switching modes between a first read operation performed while the second switch element is in a non-conductive state and a second read operation performed while the second switch element is in a conductive state.

(Mode 17)

The semiconductor device according to mode 16, wherein a determination threshold for a resistance state determined in the second read operation is higher than a determination threshold for a resistance state determined in the first read operation.

(Mode 18)

The semiconductor device according to any one of modes 1 to 17, wherein a plurality of control circuits, each of which corresponds to the control circuit and which share the power supply line, are aligned in a first direction.

(Mode 19)

A semiconductor device including: a resistive memory element; a data line electrically coupled to the resistive memory element; a control line; a control circuit including a feedback circuit coupled to the data line and controlling a potential of a second node, a second transistor, and a first switch element arranged between a first power supply and the control line, wherein the second transistor has a gate coupled to an output node of the feedback circuit, one of a source and a drain coupled to the data line, and the other one of the source and the drain coupled to the control line, and wherein the feedback circuit includes a third switch element between the second node and the output node of the feedback circuit.

(Mode 20)

The semiconductor device according to mode 19, wherein the first and third switch elements are set in a conductive state, and the feedback circuit controls the second node to have a higher potential when the potential of the data line is lower than a first setting voltage and controls the second node to have a lower potential when the potential of the data line is higher than the first setting voltage.

(Mode 21)

The semiconductor device according to mode 19 or 20, further including a second capacitive element having one terminal coupled to the output node of the feedback circuit and the other terminal supplied with a voltage width control signal whose amplitude can be controlled.

(Mode 22)

The semiconductor device according to mode 21, performing a first control operation in which the first and third switch elements are set in a conductive state and the data line is charged with the first setting voltage and performing, after the first control operation, a sixth control operation in which the first and third switch elements are set in a non-conductive state and the voltage width control signal is decreased by a predetermined amplitude voltage to determine the potential decrease rate of the control line.

(Mode 23)

The semiconductor device according to mode 22, wherein the semiconductor device determines the potential decrease rate of the control line in the sixth control operation by determining the potential of the control line a predetermined time after the timing when the first and third switch elements are set in a non-conductive state.

(Mode 24)

The semiconductor device according to mode 23 further including: a reference resistance element; a reference data line coupled to the reference resistance element; a reference control line; and a reference control circuit having substantially the same configuration as that of the control circuit and controlling the reference data line and the reference control line, instead of the data line and the control line, wherein, in the first control operation, the reference data line is also charged with the first setting voltage in the same way as the data line, and wherein, in the sixth control operation, the predetermined time is set on the basis of decrease of the potential of the reference control line.

(Mode 25)

The semiconductor device according to any one of modes 19 to 24, wherein the feedback circuit further includes: a first constant current element; and a first transistor having a gate coupled to the data line, one of a source and a drain coupled to the first constant current element, and the other one of the source and the drain coupled to the power supply line.

(Mode 26)

The semiconductor device according to mode 25 further including: a voltage generator supplying a voltage to the power supply line, wherein the voltage generator supplies a first voltage, which is a sum of a first setting voltage applied to the data line and an absolute value of a threshold voltage of the first transistor, to the power supply line.

(Mode 27)

The semiconductor device according to mode 26, wherein the voltage generator supplies the first voltage to the power supply line in the first control operation and stops supplying the first voltage in the sixth control operation.

(Mode 28)

The semiconductor device according to any one of modes 25 to 27, wherein the first constant current element is a resistor.

(Mode 29)

The semiconductor device according to any one of modes 25 to 27, wherein the first constant current element in the control circuit is configured by a third transistor, wherein a first constant current source and a fourth transistor that forms a current mirror circuit with the third transistor are arranged outside the control circuit, and wherein a current flowing through the third transistor is controlled by the current mirror circuit on the basis of a current flowing through the first constant current source.

(Mode 30)

The semiconductor device according to mode 29, wherein the voltage generator includes a fifth transistor having a gate and a drain supplied with the first setting voltage and having a source supplied with a current equivalent to that flowing through the first constant current source, and wherein the voltage generator uses a source voltage of the fifth transistor as a reference voltage and generates the first voltage controlled by the reference voltage.

(Mode 31)

The semiconductor device according to mode 24 further including: a second switch element and a first capacitive element having one end coupled to the reference data line via the second switch element, wherein the semiconductor device is configured to be capable of switching modes between a first read operation performed while the second switch element is in a non-conductive state and a second read operation performed while the second switch element is in a conductive state.

(Mode 32)

The semiconductor device according to mode 31, wherein a determination threshold for a resistance state determined in the second read operation is higher than a determination threshold for a resistance state determined in the first read operation.

(Mode 33)

The semiconductor device according to any one of modes 19 to 32, wherein a plurality of control circuits, each of which corresponds to the control circuit and which share the power supply line, are aligned in a first direction.

Modifications and adjustments of the exemplary embodiments are possible within the scope of the overall disclosure (including the claims and the drawings) of the present invention and based on the basic technical concepts of the present invention. Various combinations and selections of various disclosed elements (including the elements in each of the claims, exemplary embodiments, drawings, etc.) are possible within the claims of the present invention. That is, embodiments of the present invention of course include various variations and modifications that could be made by those skilled in the art according to the overall disclosure including the claims and the drawings and the technical concept. The description discloses numerical value ranges. However, even if the description does not particularly disclose arbitrary numerical values or small ranges included in the ranges, these values and ranges should be deemed to have been specifically disclosed.

What is claimed is:

1. A semiconductor device, comprising:
   a resistive memory element;
   a data line electrically coupled to the resistive memory element;
   a control line;
   a power supply line; and
   a control circuit comprising a first constant current element, a first transistor, and a second transistor,
   wherein, in the control circuit, the first transistor has a gate coupled to the data line, one of a source and a drain coupled to the first constant current element, and the other one of the source and the drain coupled to the power supply line, and
   wherein, in the control circuit, the second transistor has a gate coupled to one of the source and the drain of the first transistor, one of a source and a drain coupled to the data line, and the other one of the source and the drain coupled to the control line.

2. The semiconductor device as claimed in claim 1, further comprising:
   a voltage generator configured to supply a voltage to the power supply line,
   wherein the voltage generator supplies a first voltage to the power supply line, wherein the first voltage is a sum of a first setting voltage applied to the data line and an absolute value of a threshold voltage of the first transistor.

3. The semiconductor device as claimed in claim 2,
   wherein the control circuit comprises a first switch element coupled between a first power supply and the control line, and
   wherein the semiconductor device performs a first control operation in which the first switch element is set in a conductive state and the first voltage is supplied from the voltage generator to the power supply line to charge the data line with the first setting voltage.

4. The semiconductor device as claimed in claim 3, further comprising:
   a second constant current element configured to supply a constant current to the control line,
   wherein, after the first control operation, the semiconductor device performs a second control operation in which the first switch element is set in a non-conductive state and the potential of the control line is determined a predetermined time after the timing when the first switch element is set in a non-conductive state.

5. The semiconductor device as claimed in claim 3,
   wherein the voltage generator is configured to supply the first voltage or a second voltage to the power supply line, wherein the first voltage or the second voltage is a sum of a second setting voltage set lower than the first setting voltage and the absolute value of the threshold voltage of the first transistor, and
   wherein, after the first control operation, the semiconductor device performs a third control operation in which the first switch element is set in a non-conductive state, the voltage generator changes the voltage supplied to the power supply line to the second voltage, and the potential of the control line is determined a predetermined time after the timing when the first switch element is set in a non-conductive state.

6. The semiconductor device as claimed in claim 5, further comprising:
   a reference resistance element;
   a reference data line coupled to the reference resistance element;
   a reference control line; and
   a reference control circuit having substantially the same configuration as that of the control circuit and configured to control the reference data line and the reference control line, instead of the data line and the control line,
   wherein, in the first control operation, the reference data line is charged with the first setting voltage in the same way as the data line, and
   wherein, in the third control operation, the predetermined time is set on the basis of change of the potential of the reference control line.

7. The semiconductor device as claimed in claim 6, further comprising:
   a second switch element and a first capacitive element having one end coupled to the reference data line via the second switch element,
   wherein the semiconductor device is configured to be capable of switching modes between a first read operation performed while the second switch element is in a non-conductive state and a second read operation performed while the second switch element is in a conductive state.

8. The semiconductor device as claimed in claim 2,
   wherein the control circuit further comprises: a write circuit comprising a latch circuit configured to store write data and a data line drive circuit configured to apply a write voltage to the data line on the basis of the write data stored in the latch circuit,
   wherein the write circuit is coupled to a first node where one of the source and the drain of the first transistor is coupled to the gate of the second transistor, and
   wherein the write circuit inverts the write data stored in the latch circuit on the basis of change of the potential of the first node to inactivate the data line drive circuit.

9. The semiconductor device as claimed in claim 8,
   wherein the semiconductor device performs a fourth control operation in which, if the write data stored in the latch circuit is compatible with a predetermined write operation, the data line drive circuit applies the write voltage to the data line to write the data, and
   wherein, after the fourth control operation, the semiconductor device performs a fifth control operation in which the application of the write voltage is stopped and the potential of the control line is determined a predetermined time after the timing when the application of the write voltage is stopped.

10. The semiconductor device as claimed in claim 9,
    wherein, in the fifth control operation, if change of the potential of the first node is not detected and if the write data stored in the latch circuit is not inverted, the fourth and fifth control operations are repeated.

11. The semiconductor device as claimed in claim 9, further comprising:
    a reference resistance element;
    a reference data line coupled to the reference resistance element;
    a reference control line; and
    a reference control circuit having substantially the same configuration as that of the control circuit and configured to control the reference data line and the reference control line, instead of the data line and the control line, wherein, in the fifth control operation, the predetermined time is set on the basis of change of the potential of a first reference node in the reference control circuit corresponding to the first node in the control circuit.

12. The semiconductor device as claimed in claim 1, wherein the first constant current element in the control circuit is configured by a third transistor, wherein a first constant current source and a fourth transistor that forms a current mirror circuit with the third transistor are arranged outside the control circuit, and wherein a current flowing through the third transistor is controlled by the current mirror circuit on the basis of a current flowing through the first constant current source.

13. A semiconductor device, comprising:

a plurality of resistive memory cells;

a plurality of first data lines coupled to the resistive memory cells, respectively;

a plurality of second data lines;

a voltage generator configured to generate an internal voltage at an output node;

a plurality of feedback circuits each coupled to a corresponding one of the first data lines, a corresponding one of the second data lines and the output node of the voltage generator, and being configured to drive the corresponding one of the second data lines in response to a potential of the corresponding one of the first data lines and the internal voltage.

14. The semiconductor device as claimed in claim 13, wherein the voltage generator is configured to be supplied with a first external voltage which is lower than the internal voltage and a second external voltage which is higher than the internal voltage.

15. The semiconductor device as claimed in claim 13, wherein the voltage generator is configured to generate an additional voltage different from the internal voltage at an additional output node, each of the feedback circuits being coupled to the additional output node of the voltage generator, and each of the feedback circuits being configured to drive the corresponding one of the second data lines in response to the potential of the corresponding one of the first data lines, the internal voltage and the additional internal voltage.

16. The semiconductor device as claimed in claim 13, wherein each of the feedback circuits comprises a first constant current element, a first transistor and a second transistor, and wherein, in each of the feedback circuits, the first transistor has a gate coupled to the first data line, one of a source and a drain coupled to the first constant current element, and the other one of the source and the drain coupled to the output node of the voltage generator.

17. The semiconductor device as claimed in claim 16, wherein, in each of the feedback circuits, the second transistor has a gate coupled to one of the source and the drain of the first transistor, one of a source and a drain coupled to the first data line, and the other one of the source and the drain coupled to the second data line.

18. The semiconductor device as claimed in claim 16, wherein the first constant current element in each of the feedback circuits is configured by a third transistor, and wherein a first constant current source and a fourth transistor that forms a current mirror circuit with the third transistor are arranged outside each of the feedback circuits, and wherein a current of the third transistor is controlled by the current mirror circuit on the basis of a current of the first constant current source.

19. The semiconductor device as claimed in claim 18, wherein each of the feedback circuits further comprises a switch element coupled between the second transistor and the third transistor.

20. The semiconductor device as claimed in claim 19, wherein each of the feedback circuits further comprises a capacitive element having one terminal coupled to one of the source and the drain of the third transistor and the other terminal supplied with a voltage width control signal whose amplitude can be controlled.

* * * * *